US012813313B2

(12) United States Patent
Aizawa

(10) Patent No.: US 12,813,313 B2
(45) Date of Patent: Nov. 24, 2026

(54) CONNECTION STRUCTURAL BODY AND SEMICONDUCTOR DEVICE

(71) Applicant: SHINKO ELECTRIC INDUSTRIES CO., LTD., Nagano-ken (JP)

(72) Inventor: Mitsuhiro Aizawa, Nagano (JP)

(73) Assignee: SHINKO ELECTRIC INDUSTRIES CO., LTD., Nagano-Ken (JP)

( * ) Notice: Subject to any disclaimer, the term of this patent is extended or adjusted under 35 U.S.C. 154(b) by 408 days.

(21) Appl. No.: 18/347,904

(22) Filed: Jul. 6, 2023

(65) Prior Publication Data

US 2024/0021556 A1 Jan. 18, 2024

(30) Foreign Application Priority Data

Jul. 12, 2022 (JP) ................................ 2022-111825

(51) Int. Cl.

*H10W 72/20* (2026.01)
*H10W 72/00* (2026.01)

(Continued)

(52) U.S. Cl.

CPC ......... *H10W 72/20* (2026.01); *H10W 72/072* (2026.01); *H10W 72/90* (2026.01); (Continued)

(58) Field of Classification Search

CPC . H01L 2224/04042; H01L 2224/02125; H01L 24/02–09; H01L 24/17; H01L 24/16; H01L 24/13; H01L 24/81; H01L 2224/08111; H01L 2224/08112; H01L 2224/08145–08148; H01L 2224/08503; H01L 2224/165–16507; H01L 2224/32503; H01L 2224/32507; H01L 2224/40507; H01L 2224/38507; H01L 2224/8081; H01L 2224/8181;

(Continued)

(56) References Cited

U.S. PATENT DOCUMENTS

2008/0001288 A1* 1/2008 Sogawa .............. H05K 3/3436 257/734
2013/0087912 A1* 4/2013 Shimizu ................. H01L 24/13 257/737

(Continued)

FOREIGN PATENT DOCUMENTS

JP 2013093547 A 5/2013
JP 2022083976 A 6/2022

OTHER PUBLICATIONS

Office Action for JP application No. 2022-111825, dated Dec. 23, 2025, 7 pages.

*Primary Examiner* — Wael M Fahmy
*Assistant Examiner* — Thomas Wilson Mccoy
(74) *Attorney, Agent, or Firm* — Renner, Otto, Boisselle & Sklar, LLP

(57) ABSTRACT

A connection structural body includes a first connection terminal, a second connection terminal facing the first connection terminal, and a bonding member bonding the first connection terminal and the second connection terminal. The bonding member includes an intermetallic compound layer that is formed by a roughened-surface metal film, structured by deposits of metal piled over one another such that a large number of pores are formed, and a solder layer that is disposed in the pores.

6 Claims, 14 Drawing Sheets

(51) Int. Cl.
*H10W 72/90* (2026.01)
*H10W 90/00* (2026.01)

(52) U.S. Cl.
CPC .... *H10W 72/07236* (2026.01); *H10W 72/221* (2026.01); *H10W 72/222* (2026.01); *H10W 72/252* (2026.01); *H10W 90/724* (2026.01); *H10W 90/794* (2026.01)

(58) Field of Classification Search
CPC ..... H01L 2224/8281; H01L 2224/8381; H01L 2224/8481; H01L 2224/8581; H01L 2224/8681; H01L 2224/08238; H01L 2224/16227; H01L 2224/16238; H01L 2924/01327; H10W 72/3528; H10W 72/5528; H10W 72/6528; H10W 72/9528; H10W 72/222; H10W 72/223; H10W 72/225; H10W 72/231–235; H10W 72/241–245; H10W 72/252–2528; H10W 72/255; H10W 90/00
See application file for complete search history.

(56) References Cited

U.S. PATENT DOCUMENTS

| | | | | |
|---|---|---|---|---|
| 2015/0024555 | A1 | 1/2015 | Shimizu et al. | |
| 2016/0222519 | A1* | 8/2016 | Janssen .................... | C23G 1/20 |
| 2020/0402950 | A1* | 12/2020 | Hou ....................... | B23K 35/00 |
| 2022/0165695 | A1 | 5/2022 | Ahmed et al. | |

* cited by examiner

CONNECTION STRUCTURAL BODY AND SEMICONDUCTOR DEVICE

CROSS-REFERENCE TO RELATED APPLICATIONS

This application is based upon and claims the benefit of priority from prior Japanese Patent Application No. 2022-111825, filed on Jul. 12, 2022, the entire contents of which are incorporated herein by reference.

FIELD

This disclosure relates to a connection structural body, a semiconductor device, and a method for manufacturing a connection structural body.

BACKGROUND

Japanese Laid-Open Patent Publication No. 2013-93547 describes a semiconductor device in which an electrode pad of a semiconductor element and a connection terminal of a wiring substrate are bonded together using a solder layer.

SUMMARY

The pitch between connection terminals of a wiring substrate has become narrower as a result of sophistication of semiconductor elements. However, when the pitch of the connection terminals becomes narrower, short-circuiting is more likely to occur between adjacent solder layers after reflow soldering is performed. Short-circuiting between adjacent solder layers leads to short-circuiting between adjacent connection terminals.

In one embodiment, a connection structural body includes a first connection terminal, a second connection terminal facing the first connection terminal, and a bonding member bonding the first connection terminal and the second connection terminal. The bonding member includes an intermetallic compound layer that is formed by a roughened-surface metal film, structured by deposits of metal piled over one another such that a large number of pores are formed, and a solder layer that is disposed in the pores.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
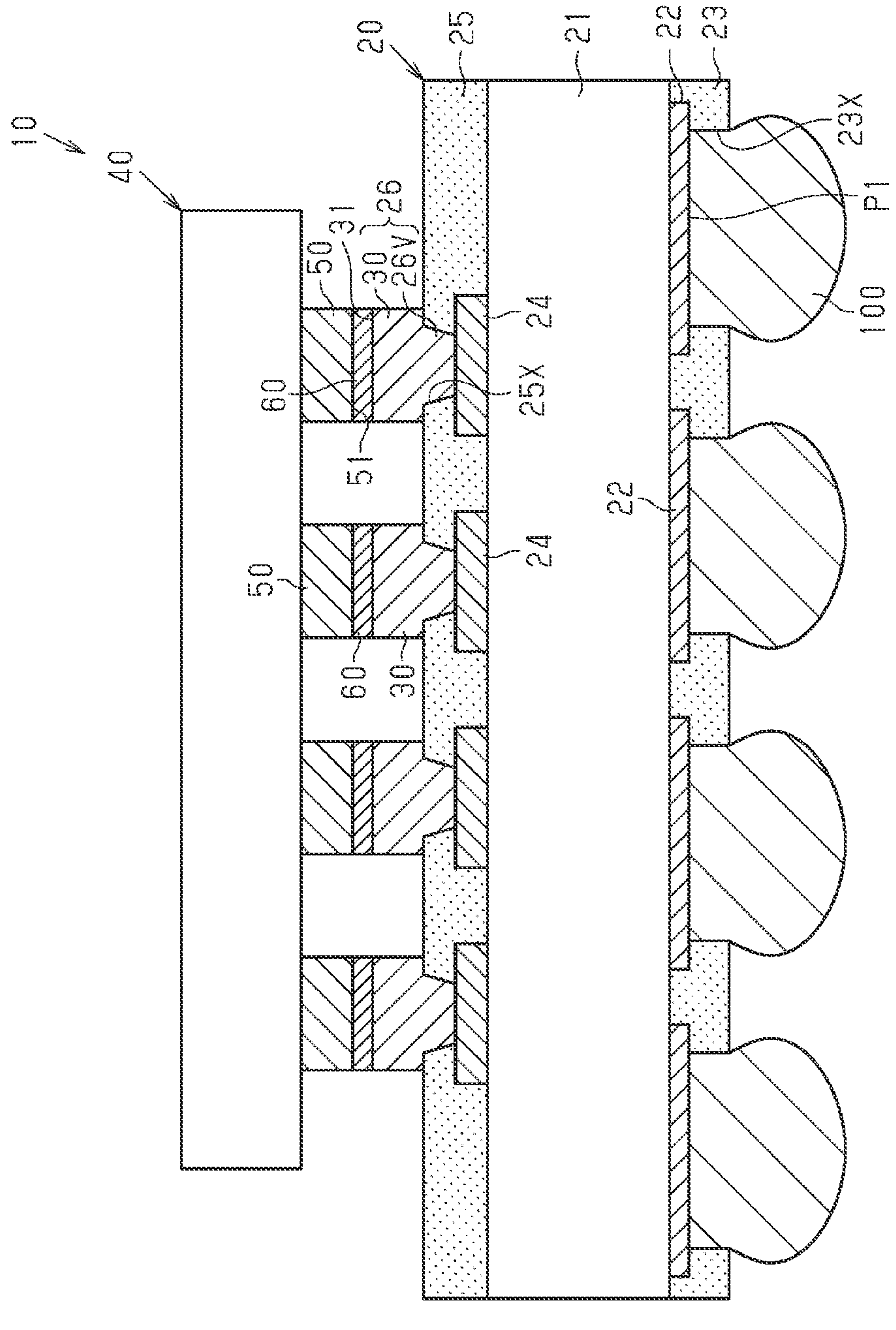
FIG. 1 is a schematic cross-sectional view of a semiconductor device in accordance with a first embodiment.

Embodiments will now be described with reference to the drawings. The drawings may not be to scale, and the relative size, proportions, and depiction of elements in the drawings may be exaggerated for clarity, illustration, and convenience. Also, to facilitate understanding, hatching lines may not be illustrated or be replaced by shadings in the cross-sectional drawings. In the present specification, "plan view" refers to a view of a subject taken in a perpendicular direction (for example, up-down direction in FIG. 1). Further, "planar shape" refers to a shape of a subject viewed in the perpendicular direction. In the present specification, "up-down direction" and "left-right direction" refer to directions when the drawings are oriented to an appropriate position allowing reference numerals of the elements to be read correctly. Moreover, in the present specification, "parallel", "orthogonal", and "perpendicular" include not only strictly parallel, strictly orthogonal, and strictly perpendicular cases but also include generally parallel, generally orthogonal, and generally perpendicular cases within a range allowing the same advantages to be obtained.

First Embodiment

A first embodiment will now be described with reference to FIGS. 1 to 7.

Semiconductor Device 10

As illustrated in FIG. 1, a semiconductor device 10 includes a wiring substrate 20 and one or more semiconductor elements 40 (one semiconductor element 40 in this case). The wiring substrate 20 includes first connection terminals 30. The semiconductor element 40 includes second connection terminals 50 facing the first connection terminals 30. The semiconductor device 10 includes bonding members 60 each bonding one of the first connection terminals 30 and a corresponding one of the second connection terminals 50. The semiconductor device 10 includes, for example, external connection terminals 100.

Wiring Substrate 20

The wiring substrate 20 includes, for example, a substrate body 21. A wiring layer 22 and a solder resist layer 23 are formed on a lower surface of the substrate body 21 in this order. A wiring layer 24, an insulating layer 25, and a wiring layer 26 are formed on an upper surface of the substrate body 21 in this order.

The substrate body 21 may be, for example, a wiring structural body in which insulating resin layers and wiring layers are alternately arranged one upon another. The wiring structural body may include, for example, a substrate core. Alternatively, the wiring structural body does not have to include a substrate core. The material of the insulating resin layer may be, for example, a thermosetting insulating resin. The thermosetting insulating resin may be, for example, an insulating resin such as an epoxy resin, a polyimide resin, or a cyanate resin. Further, the material of the insulating resin layer may be, for example, an insulating resin having a photosensitive resin, such as a phenol-based resin or a polyimide-based resin, as a main component. The insulating resin layer may include, for example, a filler such as silica or alumina.

The material of the wiring layers of the substrate body 21 and the wiring layers 22 and 24 may be, for example, copper (Cu) or a copper alloy. The material of the solder resist layer 23 may be, for example, an insulating resin having a photosensitive resin, such as a phenol-based resin or a polyimide-based resin, as a main component. The solder resist layer 23 may include, for example, a filer such as silica or alumina.

Wiring Layer 22

The wiring layer 22 is formed on the lower surface of the substrate body 21. The wiring layer 22 is the lowermost wiring layer of the wiring substrate 20.

Solder Resist Layer 23

The solder resist layer 23 is formed on the lower surface of the substrate body 21 and covers parts of the wiring layer 22. The solder resist layer 23 is the outermost (here, lowermost) insulating layer of the wiring substrate 20.

The solder resist layer 23 includes a plurality of openings 23X formed to expose parts of a lower surface of the wiring layer 22 as external connection pads P1. The external connection terminals 100 are respectively connected to the external connection pads P1 and are used to mount the wiring substrate 20 on a mounting board such as a motherboard or the like.

When necessary, a surface-processed layer is formed on the lower surface of the wiring layer 22, which is exposed from the bottom of each opening 23X. Examples of the surface-processed layer include a gold (Au) layer, a nickel (Ni) layer/Au layer (metal layer in which Ni layer and Au layer are formed in this order), a Ni layer/palladium (Pd) layer/Au layer (metal layer in which Ni layer, Pd layer, and Au layer are formed in this order), or the like. Examples of the surface-processed layer further include a Ni layer/Pd layer (metal layer in which Ni layer and Pd layer are formed in this order), a Pd layer/Au layer (metal layer in which Pd layer and Au layer are formed in this order), or the like. The Au layer is a metal layer of Au or a Au alloy. The Ni layer is a metal layer of Ni or a Ni alloy. The Pd layer is a metal layer of Pd or a Pd alloy. The Au layer, Ni layer, and Pd layer may each be, for example, a metal layer (electroless plating layer) formed by an electroless plating process or a metal layer (electrolytic plating layer) formed by an electrolytic plating process. Further, the surface-processed layer may be an organic solderability preservative (OPS) film formed by performing an antioxidation process such as an OSP process on the lower surface of the wiring layer 22, which is exposed from the openings 23X. The OSP film may be an organic coating of an azole compound, an imidazole compound, or the like. When the surface-processed layer is formed on the lower surface of the wiring layer 22, the surface-processed layer functions as the external connection pads P1.

In the example illustrated in FIG. 1, the external connection terminals 100 are arranged on the lower surface of the wiring layer 22. Alternatively, the external connection terminals may be the wiring layer 22, which is exposed from the openings 23X, or the surface-processed layer, which is formed on the lower surface of the wiring layer 22.

Wiring Layer 24

The wiring layer 24 is formed on the upper surface of the substrate body 21. The wiring layer 24 is electrically connected to the wiring layer 22 via, for example, wiring layers and through-electrodes in the substrate body 21.

Insulating Layer 25

The insulating layer 25 is formed on the upper surface of the substrate body 21 and covers parts of the wiring layer 24. The insulating layer 25 is the outermost (here, uppermost) insulating layer of the wiring substrate 20. The insulating layer 25 may be, for example, the same insulating layer as the insulating layer of the substrate body 21. Alternatively, the insulating layer 25 may be, for example, a solder resist layer. The material of the solder resist layer may be, for example, the same material as the solder resist layer 23.

The insulating layer 25 includes open portions 25X extending through the insulating layer 25 in a thickness-wise direction (up-down direction in FIG. 1) to expose parts of an upper surface of the wiring layer 24. The open portion 25X may have any planar shape and any size. For example, each open portion 25X has a circular planar shape. For example, the open portion 25X is tapered so that an opening width (opening diameter) decreases from the upper side in FIG. 1 (upper surface of insulating layer 25) toward the lower side (wiring layer 24).

Wiring Layer 26

The wiring layer 26 is formed on the wiring layer 24, which is exposed from the open portions 25X. The wiring layer 26 includes, for example, via wiring 26V and the first connection terminals 30. The via wiring 26V is formed in the open portions 25X. The first connection terminals 30 are formed on the upper surface of the insulating layer 25 and are electrically connected to the wiring layer 24 by the via wiring 26V The first connection terminals 30 function as, for example, electronic component mounting pads that are electrically connected to an electronic component, such as the semiconductor element 40.

The via wiring 26V, for example, fills the open portions 25X. The via wiring 26V is shaped in correspondence with the open portions 25X. The via wiring 26V has the form of, for example, a reversed truncated cone in which the diameter of the upper surface is greater than the diameter of the lower surface.

Each first connection terminal 30 has the form of, for example, a rod projecting upward from the upper surface of the insulating layer 25. The first connection terminal 30 is, for example, a metal post. The first connection terminal 30 is, for example, cylindrical. For example, the first connection terminal 30 is formed integrally with the via wiring 26V The first connection terminal 30 may have any planar shape and any size. For example, the first connection terminal 30 may have a circular planar shape in which the diameter is in a range between 15 μm and 40 μm, inclusive. For example, the first connection terminal 30 may have a thickness in a range between 2 μm and 50 μm, inclusive.

The first connection terminal 30 includes a first opposing surface 31 (here, upper surface) facing the semiconductor element 40. For example, the first opposing surface 31 of the first connection terminal 30 is a flat surface. For example, the first opposing surface 31 extends parallel to the upper surface of the substrate body 21. For example, the first opposing surface 31 is a substantially even smooth surface.

In the present specification, "opposing" refers to a case in which two surfaces or two members face each other. Here, "opposing" refers not only to a case in which two parts are entirely facing each other but also to a case in which two parts are partially facing each other. Further, "opposing" includes both a case in which another member is located between the two parts and a case in which no member is located between the two parts.

The material of the via wiring 26V and the first connection terminal 30 may be, for example, copper or a copper alloy. In an example, the first connection terminal 30 is formed from copper. The via wiring 26V and the first connection terminal 30 may each be, for example, an electroless plating layer or an electrolytic plating layer.

Semiconductor Element 40

The semiconductor element 40 includes the second connection terminals 50 formed on a circuit formation surface (here, lower surface) of the semiconductor element 40. The semiconductor element 40 is flip-chip mounted on the wiring substrate 20. The second connection terminals 50 of the semiconductor element 40 are electrically connected to the corresponding first connection terminals 30 of the wiring substrate 20. The second connection terminals 50 are electrically connected to the first connection terminals 30 via the bonding members 60. Thus, the semiconductor element 40 is electrically connected to the first connection terminals 30 via the second connection terminals 50 and the bonding members 60.

The semiconductor element 40 may be, for example, a logic chip such as a central processing unit (CPU) chip or a graphics processing unit (GPU) chip. Further, the semiconductor element 40 may be, for example, a memory chip such as a dynamic random-access memory (DRAM) chip, a static random-access memory (SRAM) chip, or a flash memory. Multiple semiconductor elements 40 including a combination of logic chips and memory chips may be mounted on the wiring substrate 20.

Second Connection Terminal 50

The second connection terminals 50 are arranged facing the first connection terminals 30, respectively. Each second connection terminal 50 has the form of, for example, a rod projecting downward from the circuit formation surface of the semiconductor element 40. The second connection terminal 50 is, for example, a metal post. The second connection terminal 50 is, for example, cylindrical. The second connection terminal 50 may have any planar shape and any size. For example, the second connection terminal 50 may have a circular planar shape in which the diameter is in a range between 15 μm and 40 μm, inclusive. For example, the second connection terminal 50 may have a thickness in a range between 2 μm and 50 μm, inclusive.

The material of the second connection terminal 50 may be, for example, copper or a copper alloy. In an example, the second connection terminal 50 is formed from copper. The second connection terminal 50 may be an electroless plating layer or an electrolytic plating layer.

The second connection terminal 50 includes a second opposing surface 51 (here, lower surface) facing the first opposing surface 31 of the first connection terminal 30. For example, the second opposing surface 51 of the second connection terminal 50 is a flat surface. For example, the second opposing surface 51 extends parallel to the circuit formation surface of the semiconductor element 40. For example, the second opposing surface 51 is a substantially even smooth surface.

Bonding Member 60

Each bonding member 60 is bonded to, for example, the first opposing surface 31 of one of the first connection terminals 30 and the second opposing surface 51 of a corresponding one of the second connection terminals 50. The bonding member 60 electrically connects the first connection terminal 30 and the second connection terminal 50.

Figure 2:
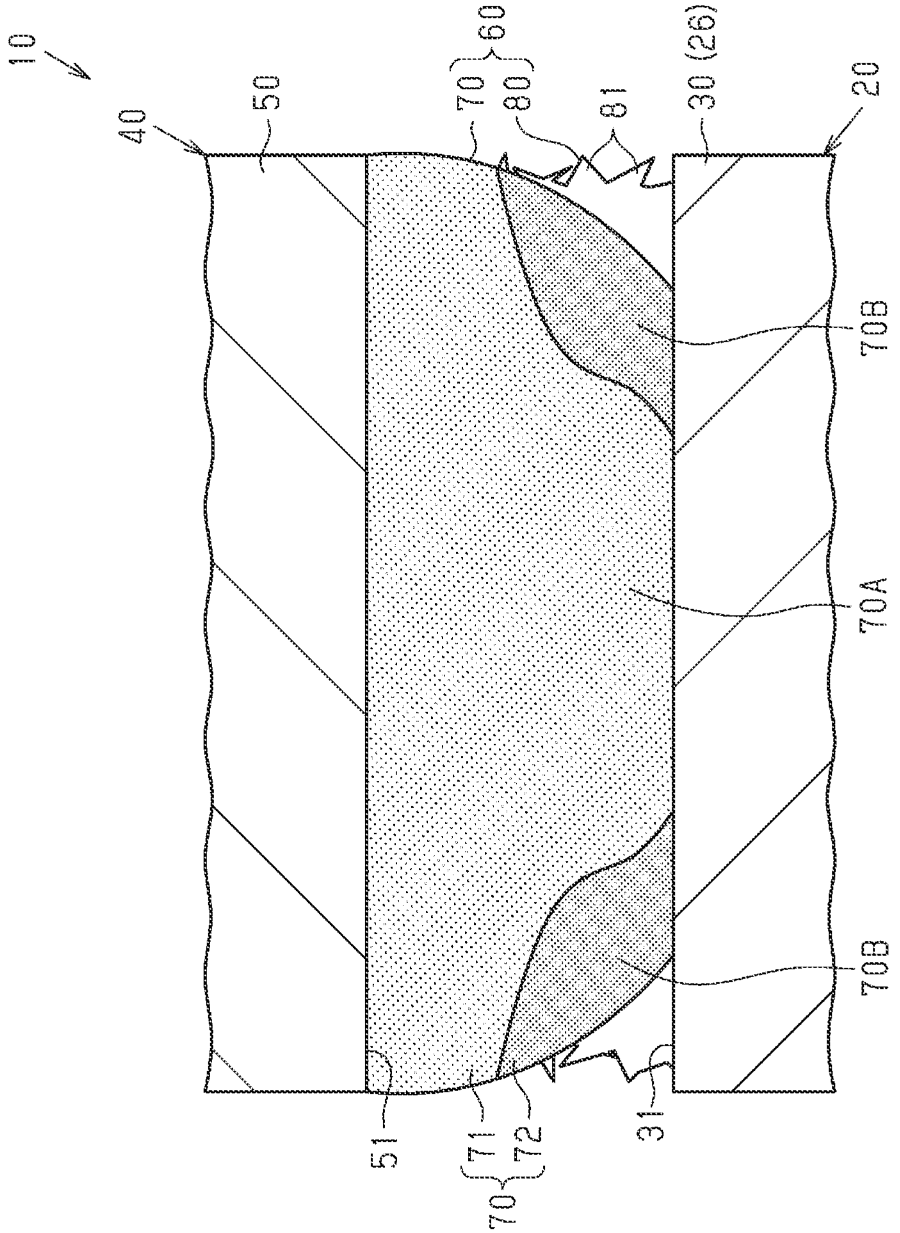
FIG. 2 is a schematic cross-sectional view illustrating part of the semiconductor device in FIG. 1.

As illustrated in FIG. 2, the bonding member 60 includes an intermetallic compound layer 70. For example, most of the bonding member 60 is formed by the intermetallic compound layer 70. In an example, the intermetallic compound layer 70 includes a portion 70A that contacts the first opposing surface 31 and an outer edge portion 70B that surrounds the portion 70A. For example, the portion 70A of the intermetallic compound layer 70 extends over the entire length of the bonding member 60 in a thickness-wise direction. In other words, the portion 70A of the intermetallic compound layer 70 extends from the first opposing surface 31 to the second opposing surface 51 in the thickness-wise direction of the bonding member 60. In the example illustrated in FIG. 2, the portion 70A of the intermetallic compound layer 70 corresponds to a central portion of the intermetallic compound layer 70 (bonding member 60) in plan view.

The intermetallic compound layer 70 is structured by, for example, a stack of a first intermetallic compound layer 71 and a second intermetallic compound layer 72 that differs from the first intermetallic compound layer 71 and is formed on the first intermetallic compound layer 71 in the thickness-wise direction of the bonding member 60. The first intermetallic compound layer 71 is formed from, for example, an intermetallic compound richer in Sn than the second intermetallic compound layer 72. The first intermetallic compound layer 71 is formed from, for example, the intermetallic compound of $Cu_6Sn_5$. The second intermetallic compound layer 72 is formed from, for example, an intermetallic compound richer in Cu than the first intermetallic compound layer 71. The second intermetallic compound layer 72 is formed from, for example, the intermetallic compound of $Cu_3Sn$. The intermetallic compound of $Cu_3Sn$ is superior to the intermetallic compound of $Cu_6Sn_5$ in physical properties such as resistance, melting temperature, Young's modulus, tensile strength, and thermal conductivity.

The first intermetallic compound layer 71 extends, for example, from the second opposing surface 51 toward the first opposing surface 31. In an example, the first intermetallic compound layer 71 extends over the entire length of the bonding member 60 in the thickness-wise direction at a central portion 70A of the intermetallic compound layer 70 in plan view. For example, a portion of the first intermetallic compound layer 71 located at the planar center of the intermetallic compound layer 70 extends from the second opposing surface 51 to the first opposing surface 31. For example, the first intermetallic compound layer 71 entirely covers the second opposing surface 51. For example, the first intermetallic compound layer 71 only covers part of the first opposing surface 31. For example, the first intermetallic compound layer 71 covers a central portion of the first opposing surface 31. The first intermetallic compound layer 71 becomes narrower from the second opposing surface 51 toward the first opposing surface 31 in the thickness-wise direction of the bonding member 60.

The second intermetallic compound layer 72 is, for example, formed on part of the first intermetallic compound layer 71 in the thickness-wise direction of the bonding member 60. Part of the second intermetallic compound layer 72 formed on the first intermetallic compound layer 71 defines the outer edge portion 70B of the intermetallic compound layer 70 in plan view. That is, the second intermetallic compound layer 72 is formed along the outer edge of the lower surface of the first intermetallic compound layer 71. In other words, the second intermetallic compound layer 72 and the first intermetallic compound layer 71 overlap only at the outer edge of the first intermetallic compound layer 71 in plan view. For example, the second intermetallic compound layer 72 covers part of the first opposing surface 31. For example, the second intermetallic compound layer 72 covers part of the first opposing surface 31 that is located farther toward the outer circumference of the first opposing surface 31 than the portion covered with the first intermetallic compound layer 71. For example, the second intermetallic compound layer 72 is formed only at a position (lower side in FIG. 2) where the bonding member 60 contacts the first opposing surface 31 in the thickness-wise direction of the bonding member 60. For example, the second intermetallic compound layer 72 does not cover the second opposing surface 51. The second intermetallic compound layer 72 has a smaller volume than the first intermetallic compound layer 71.

Figure 3:
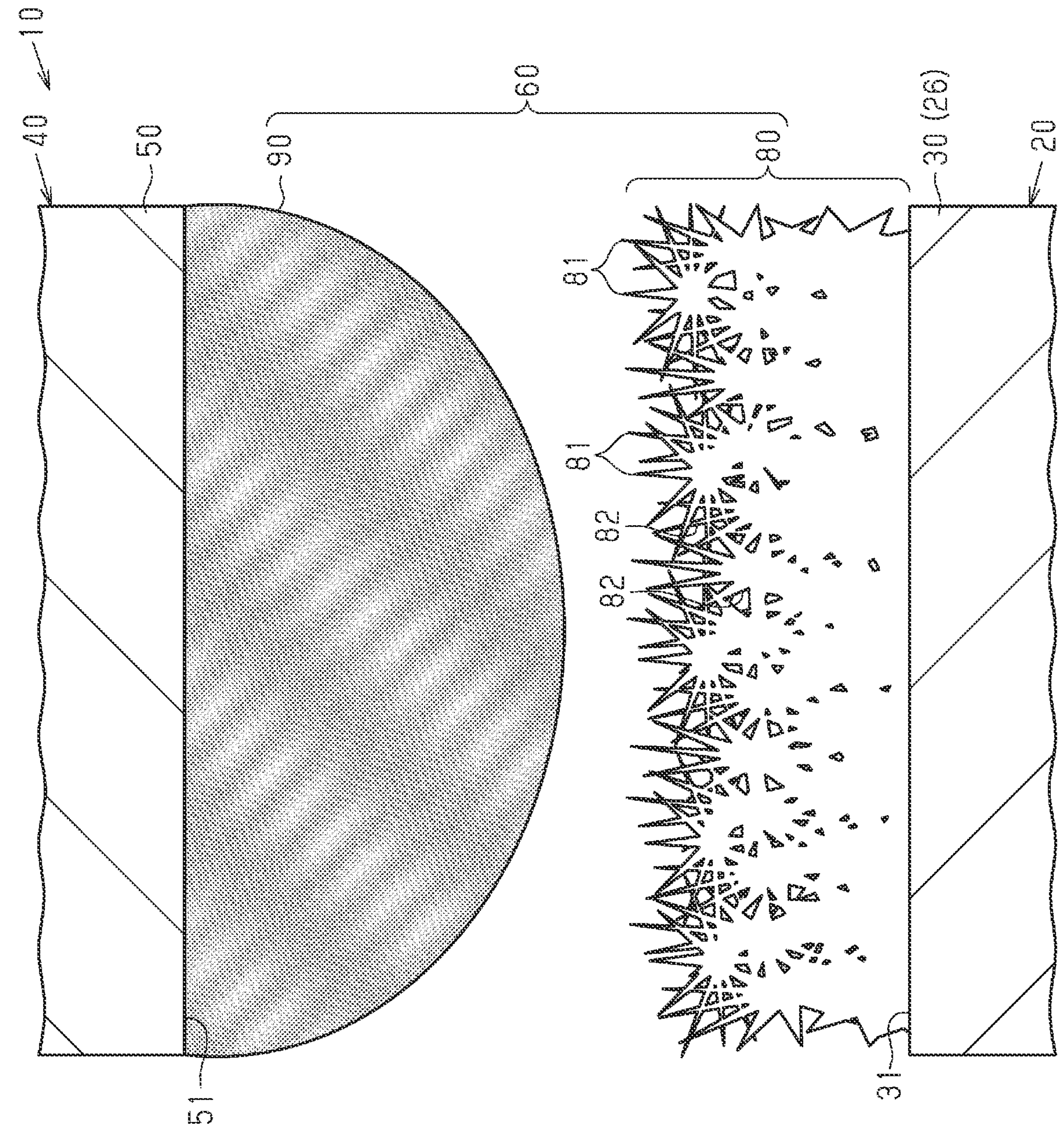
FIG. 3 is a schematic exploded cross-sectional view illustrating the part of the semiconductor device in FIG. 1.

As illustrated in FIG. 3, the bonding member 60 includes a roughened-surface copper metal film 80 formed on the first opposing surface 31 of the first connection terminal 30, and a solder layer 90 formed on the second opposing surface 51 of the second connection terminal 50. The roughened-surface copper metal film 80 is an example of a roughened-surface metal film. FIG. 3 illustrates a cross-sectional structure of part of the semiconductor device 10 before the semiconductor element 40 is bonded to the wiring substrate 20, that is, before the first connection terminals 30 are bonded to the second connection terminals 50. The structures of the roughened-surface copper metal film 80 and the solder layer 90 will be described below.

Roughened-Surface Copper Metal Film 80

The roughened-surface copper metal film 80, for example, entirely covers the first opposing surface 31. The roughened-surface copper metal film 80 exposes, for example, the side surface of the first connection terminal 30. In other words, the roughened-surface copper metal film 80 covers, for example, only the first opposing surface 31 among the surfaces of the first connection terminal 30. For example, the roughened-surface copper metal film 80 may have a thickness (film thickness) in a range between 1 μm and 5 μm, inclusive.

The roughened-surface copper metal film 80 is a plating film having a roughened surface (both upper and side surfaces or only upper surface). The surface of the roughened-surface copper metal film 80 includes microscopic irregularities. The roughened-surface copper metal film 80 is structured by deposits 81 of copper that are piled over one another on the first opposing surface 31 of the first connection terminal 30. The roughened-surface copper metal film 80 is structured by plate-shaped deposits 81 of copper piled over one another on the first opposing surface 31. The roughened-surface copper metal film 80 is a plating film formed by an electrolytic copper plating process. The roughened-surface copper metal film 80 is, for example, a metal film formed by a plating film including only copper. Here, the phrase "structured by the deposits 81 of copper that are piled over one another" refers to a structure (porous structure) in which a large number of deposits 81 (electrodeposits), which are formed from a plating metal of copper, are piled over one another in random directions such that a large number of pores 82 are formed in the metal film (plating film).

The roughened-surface copper metal film 80 of the present embodiment is structured by sheeted (thin plate-shaped) deposits 81 of copper piled over one another in various directions such that the pores 82 are formed between the sheeted deposits 81. For example, each of the sheeted deposits 81 may have a thickness in a range between 20 nm and 100 nm, inclusive. Preferably, each of the sheeted deposits 81 has a thickness, for example, in a range between 20 nm and 50 nm, inclusive. The roughened-surface copper metal film 80 is structured by a stack of a large number of layers of the sheeted deposits 81. The roughened-surface copper metal film 80 has a three-dimensional nanostructure formed by the deposits 81, which are nanoscale microscopic sheets, intersecting one another in random directions and piled over one another in a multi-layer-like manner. Such a roughened-surface copper metal film 80 is formed to have a structure in which the sheeted deposits 81 are densely piled over one another such that a large number of pores 82 are formed between the deposits 81. The structure extends over the entire roughened-surface copper metal film 80 in the thickness-wise direction of the roughened-surface copper metal film 80. That is, the roughened-surface copper metal film 80 includes a large number of microscopic pores 82 formed throughout the roughened-surface copper metal film 80 in the thickness-wise direction. The density of the deposits 81 varies, for example, in the thickness-wise direction of the roughened-surface copper metal film 80. In other words, the porosity of the roughened-surface copper metal film 80 varies, for example, in the thickness-wise direction. For example, the density of the deposits 81 increases toward the first opposing surface 31 in the thickness-wise direction of the roughened-surface copper metal film 80. In other words, the porosity of the roughened-surface copper metal film 80 decreases toward the first opposing surface 31. For example, the overall porosity of the roughened-surface copper metal film 80 may be in a range between 8% and 20%, inclusive.

In this manner, the roughened-surface copper metal film 80 is structured by a large number of deposits 81 that are piled over one another. Thus, the roughened-surface copper metal film 80 has a roughened surface structure in which the surface is uneven and a large number of pores 82 are included in the thickness-wise direction. The roughened surface structure of the roughened-surface copper metal film 80 differs from a roughened surface structure formed through a typical roughening process, such as a roughening treatment using a chemical solution or a physical processing. Examples of the typical roughening process include blackening, etching, blasting, or the like. The roughened surface structure formed by performing a typical roughening process on the first connection terminal 30 is a structure in which irregularities are formed only in the upper surface of the first connection terminal 30. Such a roughened surface structure has a high density of copper deposits over the entire roughened surface structure in the thickness-wise direction and the widthwise direction (direction orthogonal to thickness-wise direction). This roughened surface structure does not include the deposits 81 piled over one another such as that illustrated in FIG. 3, and thus pores 82 are not formed in the roughened surface structure in the thickness-wise direction or inside the metal film. The porosity of the roughened surface structure formed by a typical roughening process does not vary in the thickness-wise direction.

The roughened-surface copper metal film 80 is, for example, bonded to the first opposing surface 31 of the first connection terminal 30. No intermetallic compound is formed on the interface (bonding interface) between the first connection terminal 30 and the roughened-surface copper metal film 80. Thus, the first connection terminal 30 of copper is directly bonded to the roughened-surface copper metal film 80 of copper without another member formed from a material other than copper. The roughened-surface copper metal film 80 is integrated with the first connection terminal 30. In the drawings, the roughened-surface copper metal film 80 is distinguished from the first connection terminal 30 by a solid line to facilitate understanding. In actuality, there may be no interface between the first connection terminal 30 and the roughened-surface copper metal film 80 such that the boundary may be unclear.

Solder Layer 90

The solder layer 90, for example, entirely covers the second opposing surface 51 of the second connection terminal 50. For example, the solder layer 90 is arranged facing the roughened-surface copper metal film 80. For example, the solder layer 90 projects from the second opposing surface 51 toward the roughened-surface copper metal film 80.

The material of the solder layer 90 may be, for example, a lead (Pb)-free solder. The material of the solder layer 90 may be, for example, a lead-free solder including a relatively large amount of tin (Sn). The material of the solder layer 90 may be, for example, a lead-free solder of tin (Sn)-silver (Ag), Sn—Cu, or Sn—Ag—Cu.

The bonding member 60 includes, for example, the roughened-surface copper metal film 80 and the solder layer 90 that are integrated with each other in a reflow soldering process. The intermetallic compound layer 70 illustrated in FIG. 2 is formed by the reaction between the metal (e.g., Cu) of the roughened-surface copper metal film 80 and the metal (e.g., Sn) of the solder layer 90 that is disposed in a large number of pores 82 of the roughened-surface copper metal film 80. For example, the first intermetallic compound layer 71 and the second intermetallic compound layer 72 illustrated in FIG. 2 have a higher melting temperature than the solder layer 90.

As illustrated in FIG. 2, the bonding member 60 includes the roughened-surface copper metal film 80. The residue of part of the roughened-surface copper metal film 80 that does not form the intermetallic compound layer 70 includes the sheeted deposits 81 of copper in the bonding member 60. For example, the side surface of the bonding member 60 is structured by the sheeted deposits 81 piled over one another. For example, the side surface of the bonding member 60 includes a part (lower side in FIG. 2) close to the first opposing surface 31 that is structured by the sheeted deposits 81 that are piled over one another. In other words, the part of the side surface of the bonding member 60 close to the first opposing surface 31 is formed by the roughened-surface copper metal film 80. The roughened-surface copper metal film 80 is composed of, for example, Cu.

The bonding member 60 does not project outward from, for example, the side surface of the first connection terminal 30. In other words, the solder layer 90 (refer to FIG. 3) and the like of the bonding member 60 do not project outward from the side surface of the first connection terminal 30 in a planar direction (left-right direction in FIG. 2). The planar direction refers to, for example, a direction orthogonal to the thickness-wise direction of the roughened-surface copper metal film 80 as viewed in a cross section. The bonding member 60 does not project outward from, for example, the side surface of the second connection terminal 50. The bonding member 60 allows the first connection terminal 30 to be bonded perpendicular to the second connection terminal 50.

A connection structural body includes the first connection terminal 30, the bonding member 60, and the second connection terminal 50 described above.

External Connection Terminal 100

As illustrated in FIG. 1, the external connection terminals 100 are formed on the external connection pads P1 of the wiring substrate 20. The external connection terminals 100 are, for example, connection terminals for electrical connection with pads arranged on a mounting board such as a motherboard (not illustrated) or the like. Each external connection terminal 100 may be, for example, a solder ball or a lead pin. In the present embodiment, a solder ball is used as the external connection terminal 100.

Method for Manufacturing Semiconductor Device 10

A method for manufacturing the semiconductor device 10 will now be described with reference to FIGS. 4 to 7. Hereafter, a method for manufacturing a connection structural body will be described in detail.

Figure 4:
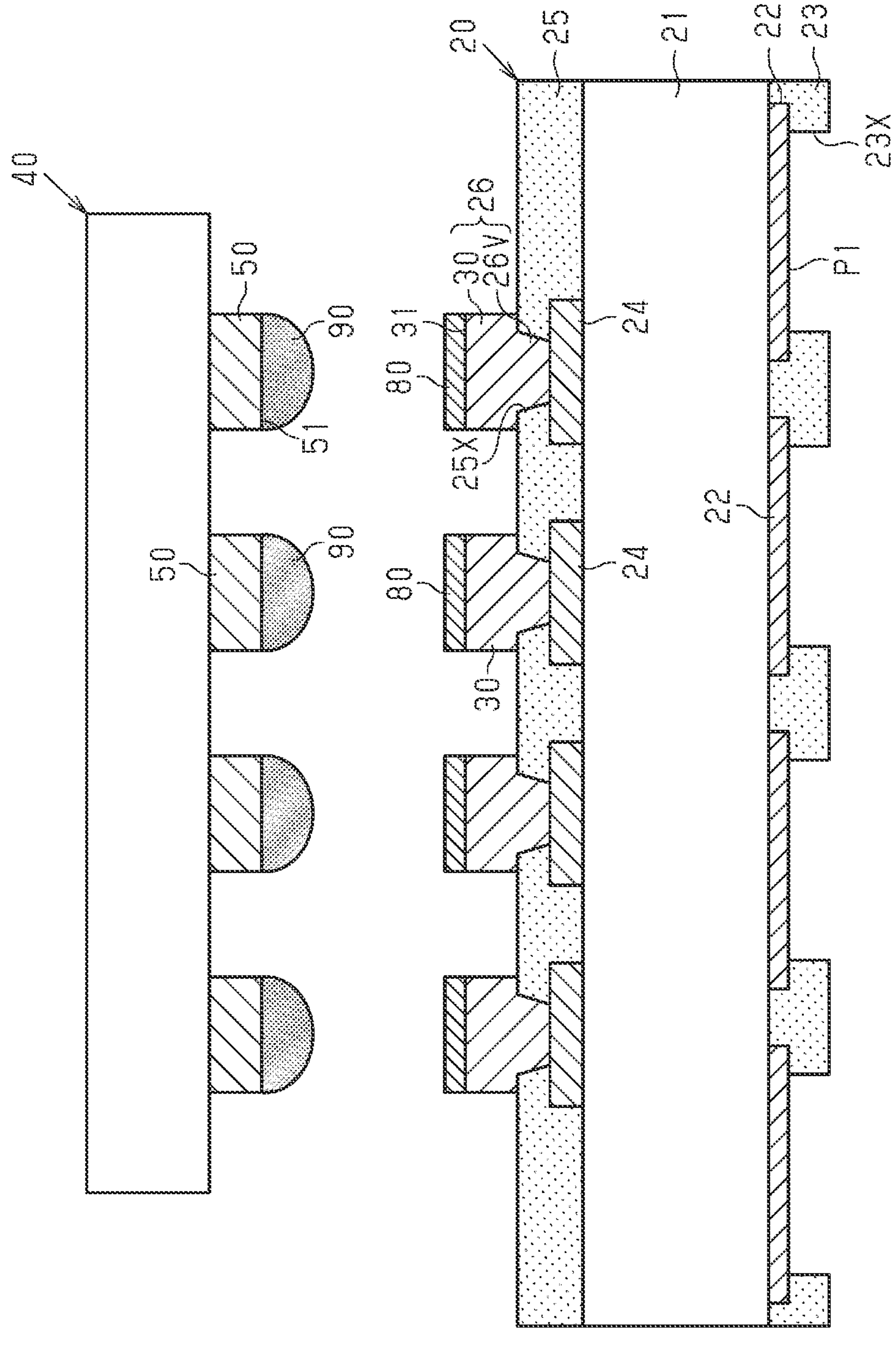
FIGS. 4, 5, 6, and 7 are schematic cross-sectional views illustrating a method for manufacturing the semiconductor device in FIG. 1.

As illustrated in FIG. 4, first, the wiring substrate 20 is prepared by forming the wiring layer 22 and the solder resist layer 23 on the lower surface of the substrate body 21. Further, the wiring layer 24, the insulating layer 25, and the wiring layer 26 are formed on the upper surface of the substrate body 21. The wiring substrate 20 may be manufactured through a standard manufacturing process, which will not be described in detail. The wiring layer 26 including the via wiring 26V and the first connection terminals 30 may be formed through, for example, a semi-additive process. In an example, first, a seed layer (not illustrated) is formed to cover the inner wall of each open portion 25X, the upper surface of the wiring layer 24 exposed at the bottom of each open portion 25X, and the upper surface of the insulating layer 25. Then, a resist pattern (not illustrated) including open portions corresponding to the first connection terminals 30 is formed on the seed layer. An electrolytic copper plating process is performed using the resist pattern as a plating mask to form the via wiring 26V and the first connection terminals 30.

Subsequently, the roughened-surface copper metal film 80 is formed on the first opposing surfaces 31 of the first connection terminals 30. The roughened-surface copper metal film 80 may be formed through an electrolytic copper plating process. The roughened-surface copper metal film 80 may be formed through, for example, an electrolytic copper plating process in which an electrolytic copper plating bath including a surface roughening agent (additive agent) is used as a plating bath, and the first connection terminals 30 and the like are used as a plating power feeding layer. In this electrolytic copper plating step, for example, a plating mask may be the resist pattern (not illustrated) used for forming the wiring layer 26. Also, the surface roughening agent added to the electrolytic copper plating bath may be a polymer. The composition of the plating bath, current density, and current amount used in the electrolytic copper plating process are appropriately adjusted so that the roughened-surface copper metal film 80 is structured by a desired roughened surface, or the deposits 81 of copper that are piled over one another (refer to FIG. 3). In particular, the shape and the density of the deposits 81 in the roughened-surface copper metal film 80 (refer to FIG. 3) may be controlled by adjusting the concentration of the surface roughening agent (additive agent), the current density, the current amount, the temperature of the plating bath, and the like in the electrolytic copper plating process.

In the step illustrated in FIG. 4, the semiconductor element 40 is prepared with the second connection terminals 50 formed on the circuit formation surface, and the solder layer 90 formed on the lower surfaces of the second connection terminals 50.

Figure 5:
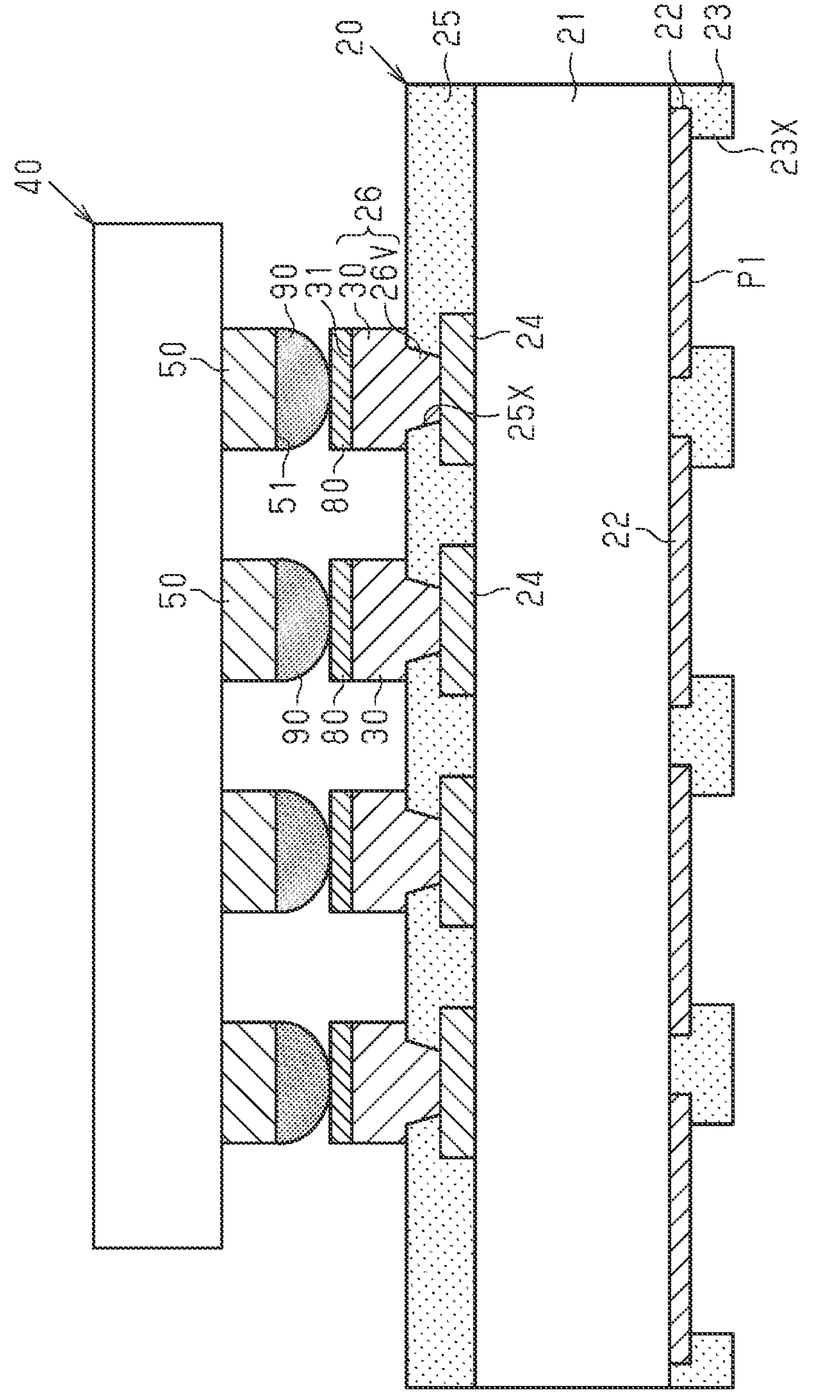

Subsequently, in the step illustrated in FIG. 5, the semiconductor element 40 including the second connection terminals 50 and the solder layer 90 is arranged above the wiring substrate 20. In this case, the wiring substrate 20 and the semiconductor element 40 are arranged such that the first connection terminals 30 face the second connection terminals 50. Then, the solder layer 90 is placed on the roughened-surface copper metal film 80.

Figure 6:
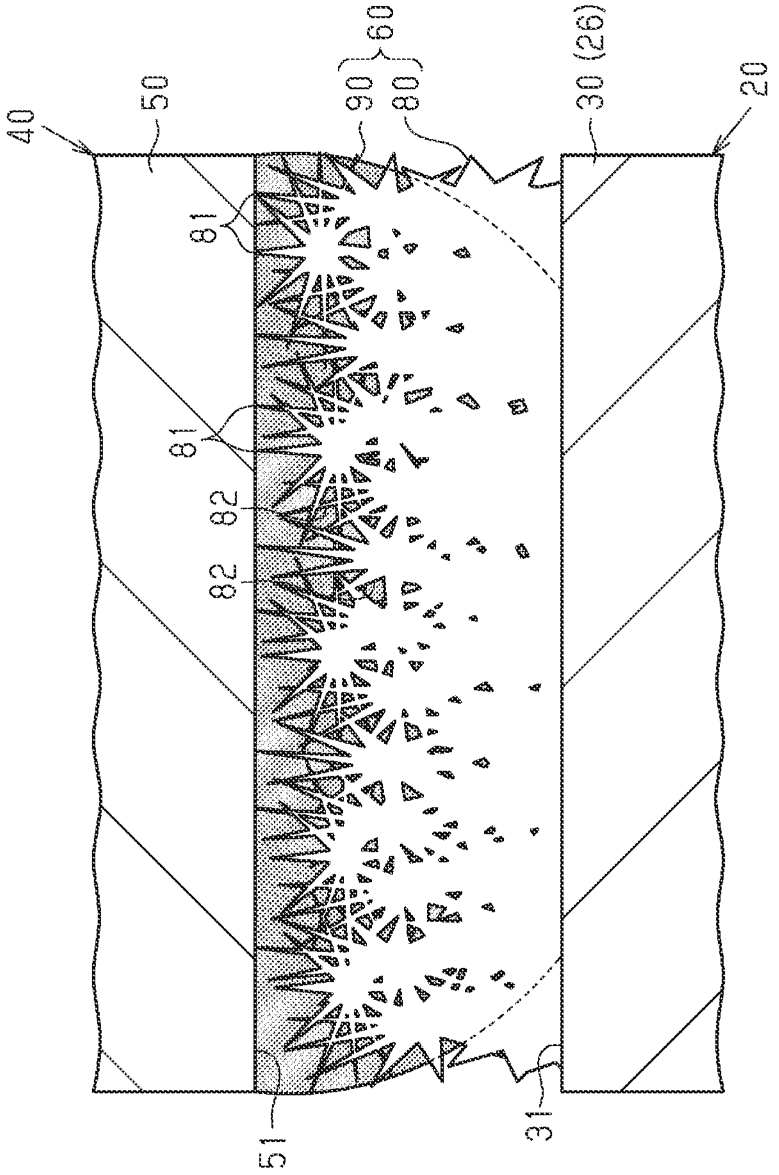
Figure 7:
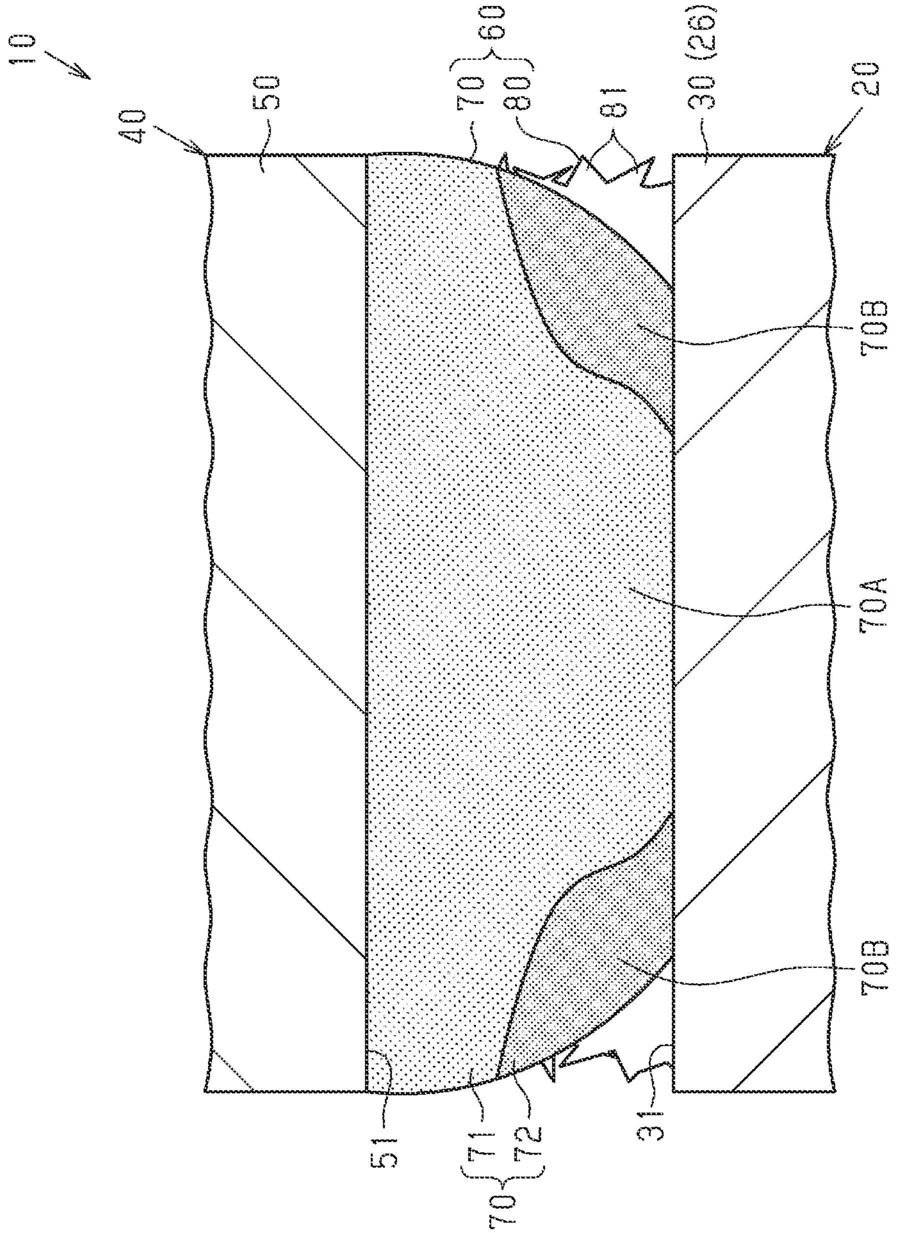

In the step illustrated in FIG. 6, the roughened-surface copper metal film 80 is bonded to the solder layer 90 in a reflow soldering process. In an example, after the solder layer 90 is placed on the roughened-surface copper metal film 80, a reflow soldering process is performed to melt the solder layer 90 and bond the solder layer 90 with the roughened-surface copper metal film 80. In the reflow soldering process, the solder layer 90 is heated at a temperature higher than the melting point of the solder layer 90. In the reflow soldering process, the melted solder layer 90 enters a large number of pores 82 of the roughened-surface copper metal film 80. In this case, the melted solder layer 90 will not spread in the planar direction since the melted solder layer 90 enters into the roughened-surface copper metal film 80 through the pores 82 of the roughened-surface copper metal film 80. In other words, the melted solder layer 90 spreads in the thickness-wise direction of the roughened-surface copper metal film 80 through the pores 82 of the roughened-surface copper metal film 80, thereby avoiding spreading of the solder layer 90 in the planar direction orthogonal to the thickness-wise direction. Then, an intermetallic compound is formed by the reaction between the metal (here, Sn) of the solder layer 90, which is disposed in the pores 82 of the roughened-surface copper metal film 80, and the metal (here, Cu) of the roughened-surface copper metal film 80. In an example, as illustrated in FIG. 7, the first intermetallic compound layer 71 formed by the intermetallic compound of $Cu_6Sn_5$ extends from the second connection terminal 50 to the first connection terminal 30. Further, the second intermetallic compound layer 72 formed by the intermetallic compound of the $Cu_3Sn$ extends along the outer edge of the lower surface of the first intermetallic compound layer 71. The residue of part of the roughened-surface copper metal film 80 does not form the intermetallic compounds. In this manner, the bonding member 60 includes the intermetallic compound layer 70, structured by the stack of the first intermetallic compound layer 71 and the second intermetallic compound layer 72, and the roughened-surface copper metal film 80. Further, the bonding member 60 electrically connects the first connection terminal 30 to the second connection terminal 50. This allows the second connection terminals 50 of the semiconductor element 40 to be flip-chip bonded to the first connection terminals 30 of the wiring substrate 20.

In the step illustrated in FIG. 6, or in the reflow soldering process, for example, the solder layer 90 is heated at a temperature higher than the melting point of the solder layer 90 until all of the Sn in the solder layer 90 becomes part of the intermetallic compound. For example, the heating is performed in the reflow soldering process until all of the Sn in the solder layer 90 reacts with Cu of the roughened-surface copper metal film 80 and becomes part of an intermetallic compound of $Cu_6Sn_5$ or the $Cu_3Sn$. For example, the heating is performed in the reflow soldering process until all of the melted solder layer 90 forms the intermetallic compound.

The semiconductor element 40 is mounted on the wiring substrate 20 through the steps described above. Subsequently, the external connection terminals 100 illustrated in FIG. 1 are formed on the external connection pads P1 illustrated in FIG. 5. This manufactures the semiconductor device 10 illustrated in FIG. 1.

The operation and advantages of the present embodiment will now be described.

(1-1) The roughened-surface copper metal film 80 is formed on the first opposing surfaces 31 of the first connection terminals 30, and the solder layer 90 is formed on the second opposing surfaces 51 of the second connection terminals 50. The roughened-surface copper metal film 80 and the solder layer 90 are bonded together and form the bonding member 60. In the reflow soldering process for bonding the roughened-surface copper metal film 80 with the solder layer 90, the melted solder layer 90 enters the pores 82 of the roughened-surface copper metal film 80. In this case, the melted solder layer 90 spreads in the thickness-wise direction of the roughened-surface copper metal film 80 through the pores 82 of the roughened-surface copper metal film 80. This avoids spreading of the solder layer 90 in the planar direction orthogonal to the thickness-wise direction. Thus, the bonding member 60 that bonds the first connection terminal 30 to the second connection terminal 50 will not spread in the planar direction. As a result, even when the pitch of the first connection terminals 30 becomes narrower, short-circuiting is less likely to occur between adjacent bonding members 60 and between adjacent first connection terminals 30. In other words, the pitch between adjacent first connection terminals 30 may be narrowed.

(1-2) The bonding member 60 includes the intermetallic compound layer 70 that is formed by the roughened-surface copper metal film 80, and the solder layer 90 that is disposed in the pores 82 of the roughened-surface copper metal film 80. The intermetallic compound layer 70 has a higher melting temperature than the solder layer 90. Thus, even when the bonding member 60 is exposed to a high-temperature environment, the bonding member 60 will not re-melt.

(1-3) In a reflow soldering process for bonding the roughened-surface copper metal film 80 to the solder layer 90, the solder layer 90 is heated at a temperature higher than the melting point of the solder layer 90 until all of the melted solder layer 90 forms an intermetallic compound. This avoids re-melting of the bonding member 60.

(1-4) The intermetallic compound layer 70 includes the portion 70A extending over the entire length of the bonding member 60 in the thickness-wise direction. In other words, the portion 70A of the intermetallic compound layer 70 extends from the first opposing surface 31 of the first connection terminal 30 to the second opposing surface 51 of the second connection terminal 50 in the thickness-wise direction of the bonding member 60. Thus, the intermetallic compound layer 70 stably bonds the first connection terminal 30 with the second connection terminal 50 and improves the connection reliability between the first connection terminal 30 and the second connection terminal 50.

(1-5) The intermetallic compound layer 70 is structured by a stack of the first intermetallic compound layer 71 and the second intermetallic compound layer 72 that is formed on the first intermetallic compound layer 71 in the thickness-wise direction of the bonding member 60. The first intermetallic compound layer 71 extends over the entire length of the bonding member 60 in the thickness-wise direction at the central portion 70A of the intermetallic compound layer 70 in plan view. That is, the central portion of the first intermetallic compound layer 71 in plan view extends from the first opposing surface 31 of the first connection terminal 30 to the second opposing surface 51 of the second connection terminal 50. Thus, the first connection terminal 30 is bonded with the second connection terminal 50 by the single layer of the first intermetallic compound layer 71 in a part of the bonding member 60. In other words, a straight line connecting the first opposing surface 31 and the second opposing surface 51 on the planar center of the bonding member 60 includes the first intermetallic compound layer 71 and does not include any interface. Therefore, the physical property values of the bonding member 60 are determined only by the physical property value of the first intermetallic compound layer 71 at the planar center of the bonding member 60. This allows the physical property values, such as the resistance value and the like, of the bonding member 60 to be set uniformly from the first opposing surface 31 to the second opposing surface 51 at the planar center of the bonding member 60.

(1-6) The roughened-surface copper metal film 80 is structured by the sheeted (thin plate-shaped) deposits 81 of copper piled over one another in various directions such that the pores 82 are formed between the sheeted deposits 81. The roughened-surface copper metal film 80 has a relatively high porosity. Thus, the melted solder layer 90 easily enters into the roughened-surface copper metal film 80 through the pores 82 in a reflow soldering process. This decreases the amount of solder used in the solder layer 90.

Second Embodiment

A second embodiment will now be described with reference to FIGS. 8 to 10. In this embodiment, the method for manufacturing the semiconductor device differs from that of the first embodiment. Hereafter, the difference from the first embodiment will be mainly described. The same reference numerals are given to those components that are the same as the corresponding components illustrated in FIGS. 1 to 7. Such elements will not be described in detail.

Figure 8:
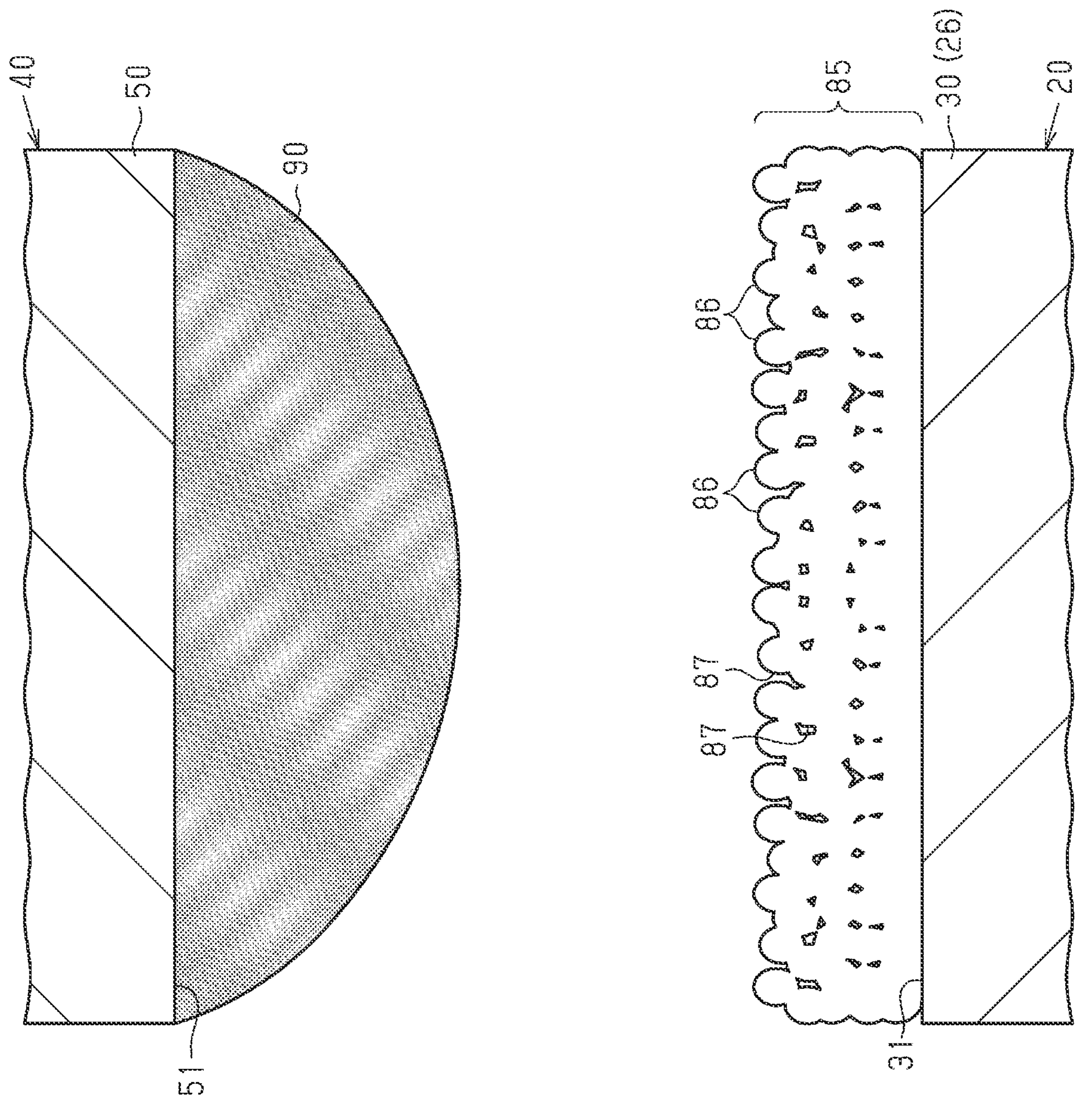
FIGS. 8, 9, and 10 are schematic cross-sectional views illustrating a method for manufacturing a semiconductor device in accordance with a second embodiment.

First, in the step illustrated in FIG. 8, a roughened-surface copper metal film 85 is formed on the first opposing surface 31 of the first connection terminal 30. The roughened-surface copper metal film 85 is an example of a roughened-surface metal film. The roughened-surface copper metal film 85 has a roughened surface structure that differs from the roughened-surface copper metal film 80 illustrated in FIG. 3. The structure of the roughened-surface copper metal film 85 will be described in detail.

The roughened-surface copper metal film 85, for example, entirely covers the first opposing surface 31. The roughened-surface copper metal film 85 is directly bonded to the first opposing surface 31. The roughened-surface copper metal film 85 is integrated with the first connection terminal 30. In the drawings, the roughened-surface copper metal film 85 is distinguished from the first connection terminal 30 by a solid line to facilitate understanding. In actuality, there may be no interface between the first connection terminal 30 and the roughened-surface copper metal film 85 such that the boundary may be unclear. For example, the roughened-surface copper metal film 85 may have a thickness (film thickness) in a range between 0.5 μm and 2 μm, inclusive.

The roughened-surface copper metal film 85 has a surface (both upper and side surfaces or only upper surface) with a structure of microscopic irregularities. The roughened-surface copper metal film 85 is structured by granulated deposits 86, which are formed from a plating metal of copper, piled over one another on the first opposing surface 31 of the first connection terminal 30. The roughened-surface copper metal film 85 includes pores 87 that are formed between the granulated deposits 86. In other words, the roughened-surface copper metal film 85 has a structure (porous structure) including a large number of pores 87. The roughened-surface copper metal film 85 is a plating film formed by an electrolytic copper plating process. The roughened-surface copper metal film 85 is, for example, a metal film formed by a plating film including only copper.

The granulated deposits 86 are, for example, spherical. For example, the granulated deposits 86 may have a particle diameter in a range between 20 nm and 100 nm or less, inclusive. Preferably, the particle diameter of the granulated second deposits 86 is, for example, in a range between 20 nm and 50 nm, inclusive. The roughened-surface copper metal film 85 is structured by a stack of a large number of layers of the granulated deposits 86. The roughened-surface copper metal film 85 has a three-dimensional nanostructure formed by the deposits 86, which are nanoscale microscopic granules, intersecting one another in random directions and piled over one another in a multi-layer-like manner. Such a roughened-surface copper metal film 85 is formed to have a structure in which the granulated deposits 86 are densely piled over one another such that a large number of pores 87 are formed between the deposits 86. The structure extends over the entire roughened-surface copper metal film 85 in a thickness-wise direction of the roughened-surface copper metal film 85. That is, the roughened-surface copper metal film 85 includes a large number of microscopic pores 87 formed throughout the roughened-surface copper metal film 85 in the thickness-wise direction. The density of the deposits 86 varies, for example, in the thickness-wise direction of the roughened-surface copper metal film 85. For example, the density of the deposits 86 increases toward the first opposing surface 31 in the thickness-wise direction of the roughened-surface copper metal film 85. For example, the overall porosity of the roughened-surface copper metal film 85 may be in a range between 10% and 25%, inclusive.

In this manner, the roughened-surface copper metal film 85 is structured by a large number of granulated deposits 86 that are piled over one another. Thus, the roughened-surface copper metal film 85 has a roughened surface structure in which the surface is uneven and a large number of pores 87 are included in the thickness-wise direction.

In the same manner as the first embodiment, the roughened-surface copper metal film 85 having the above-described structure may be formed through an electrolytic copper plating process in which an electrolytic copper plating bath including a polymer as a surface roughening agent (additive agent) is used as a plating bath, and the first connection terminals 30 and the like are used as a plating power feeding layer. The composition of the plating bath, current density, and current amount used in the electrolytic copper plating process are appropriately adjusted so that the roughened-surface copper metal film 85 is structured by a desired roughened surface, or the deposits 86 of copper that are piled over one another (refer to FIG. 8). In particular, the shape and the density of the deposits 86 in the roughened-surface copper metal film 85 may be controlled by adjusting the concentration of the surface roughening agent (additive agent), the current density, the current amount, the temperature of the plating bath, and the like in the electrolytic copper plating process. The composition of the plating bath and an electrodeposition condition for the electrolytic copper plating process are changed from those of the first embodiment.

In the step illustrated in FIG. 8, the semiconductor element 40 is prepared with the solder layer 90 formed on the lower surface of the second connection terminal 50.

Figure 9:
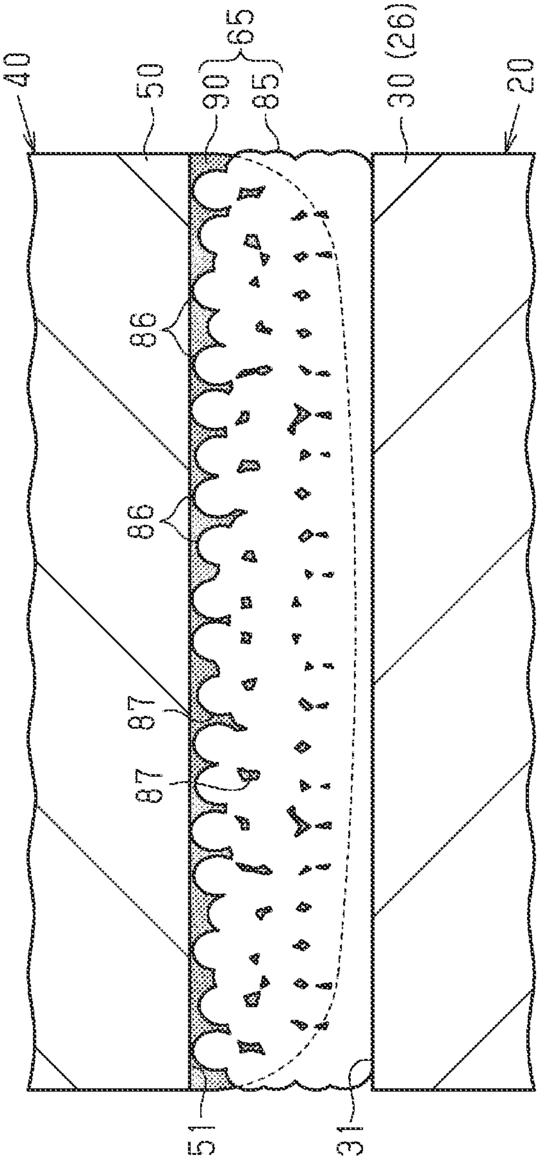

Then, in the step illustrated in FIG. 9, the roughened-surface copper metal film 85 and the solder layer 90 are bonded together and form a bonding member 65 (see FIG. 10) that bonds the first connection terminal 30 with the second connection terminal 50. In an example, after the solder layer 90 is placed on the roughened-surface copper metal film 85, a reflow soldering process is performed to melt the solder layer 90 and bond the solder layer 90 with the roughened-surface copper metal film 85. In the reflow soldering process, the solder layer 90 is heated at a temperature higher than the melting point of the solder layer 90. In the reflow soldering process, the melted solder layer 90 enters a large number of pores 87 of the roughened-surface copper metal film 85. In this case, the melted solder layer 90 will not spread in the planar direction since the melted solder layer 90 enters into the roughened-surface copper metal film 85 through the pores 87 of the roughened-surface copper metal film 85. In other words, the melted solder layer 90 spreads in the thickness-wise direction of the roughened-surface copper metal film 85 through the pores 87 of the roughened-surface copper metal film 85, thereby avoiding spreading of the solder layer 90 in the planar direction orthogonal to the thickness-wise direction. Then, an intermetallic compound is formed by the reaction between the metal (here, Sn) of the solder layer 90, which is disposed in the pores 87 of the roughened-surface copper metal film 85, and the metal (here, Cu) of the roughened-surface copper metal film 85.

Figure 10:
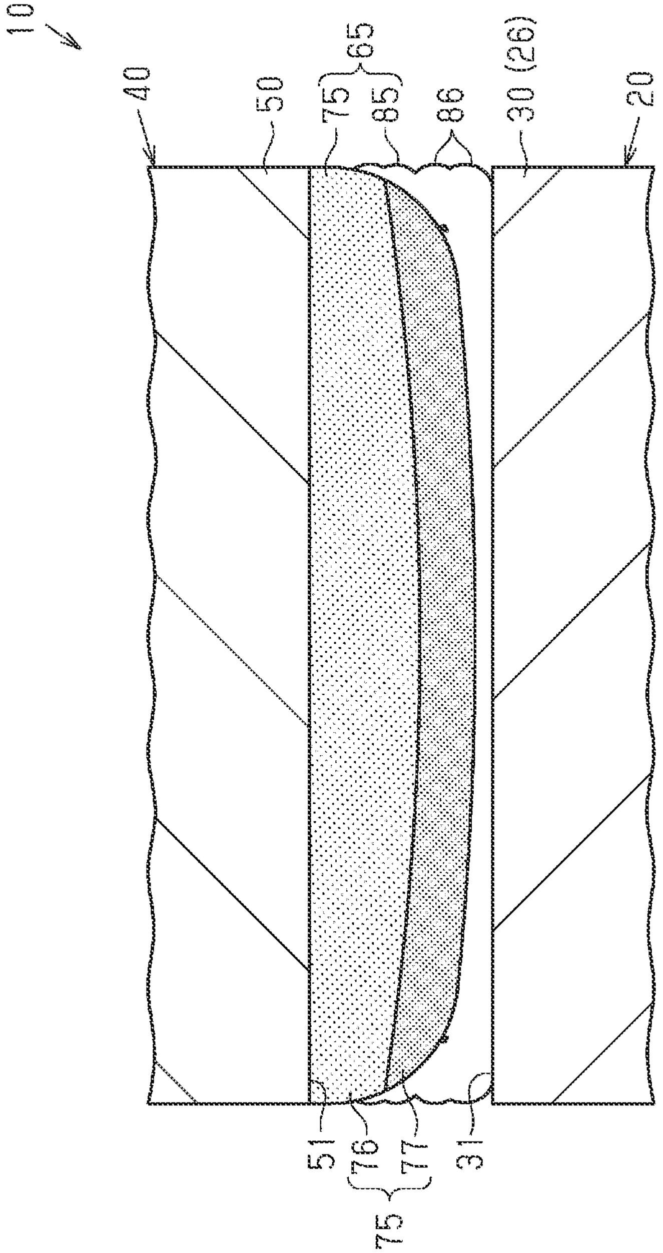

In an example, as illustrated in FIG. 10, a first intermetallic compound layer 76 contacts the second connection terminal 50, and a second intermetallic compound layer 77 is closer to the first connection terminal 30 than the first intermetallic compound layer 76. The intermetallic compound layer 75 is structured by the stack of the first intermetallic compound layer 76 and the second intermetallic compound layer 77. The first intermetallic compound layer 76 is formed from, for example, an intermetallic compound richer in Sn than the second intermetallic compound layer 77. The first intermetallic compound layer 76 is formed from, for example, the intermetallic compound of $Cu_6Sn_5$. The second intermetallic compound layer 77 is formed from, for example, an intermetallic compound richer in Cu than the first intermetallic compound layer 76. The second intermetallic compound layer 77 is formed from, for example, the intermetallic compound of $Cu_3Sn$. The residue of part of the roughened-surface copper metal film 85 does not form the intermetallic compounds. Thus, the bonding member 65 includes the intermetallic compound layer 75 and the roughened-surface copper metal film 85. The structure of the bonding member 65 will be described in detail.

The first intermetallic compound layer 76 extends, for example, from the second opposing surface 51 toward the first opposing surface 31. In the example illustrated in FIG. 10, the first intermetallic compound layer 76 extends from the second opposing surface 51 to an intermediate part of the bonding member 65 in the thickness-wise direction. In other words, the first intermetallic compound layer 76 does not reach the first opposing surface 31. For example, the first intermetallic compound layer 76 entirely covers the second opposing surface 51. For example, the first intermetallic compound layer 76 becomes narrower from the second opposing surface 51 toward the first opposing surface 31 in the thickness-wise direction of the bonding member 65. The lower surface of the first intermetallic compound layer 76 is, for example, an arched surface. The lower surface of the first intermetallic compound layer 76 is curved so that the first opposing surface 31 is closer at the planar center than the outer edge of the bonding member 65.

The second intermetallic compound layer 77 is formed on, for example, the lower surface of the first intermetallic compound layer 76. For example, the second intermetallic compound layer 77 entirely covers the lower surface of the first intermetallic compound layer 76. The second intermetallic compound layer 77 does not reach the first opposing surface 31. In other words, the second intermetallic compound layer 77 does not cover the first opposing surface 31. For example, the second intermetallic compound layer 77 becomes narrower from the first intermetallic compound layer 76 toward the first opposing surface 31 in the thickness-wise direction of the bonding member 65. The lower surface of the second intermetallic compound layer 77 is, for example, an arched surface. The lower surface of the second intermetallic compound layer 77 is curved so that the first opposing surface 31 is closer at the planar center than the outer edge of the bonding member 65. The second intermetallic compound layer 77 has a smaller volume than the first intermetallic compound layer 76.

The bonding member 65 includes, for example, the roughened-surface copper metal film 85. The residue of part of the roughened-surface copper metal film 85 that does not form the intermetallic compound includes the granulated deposits 86 of copper in the bonding member 65. For example, the side surface of the bonding member 65 is structured by the granulated deposits 86 piled over one another. For example, the side surface of the bonding member 65 includes a part (lower side in FIG. 10) close to the first opposing surface 31 that is structured by the granulated deposits 86 that are piled over one another. In other words, the part of the side surface of the bonding member 65 close to the first opposing surface 31 is formed by the roughened-surface copper metal film 85. The roughened-surface copper metal film 85 is composed of, for example, Cu. For example, the roughened-surface copper metal film 85 is arranged closer to the first opposing surface 31 than the intermetallic compound layer 75. For example, the roughened-surface copper metal film 85 covers the lower surface of the second intermetallic compound layer 77. For example, the roughened-surface copper metal film 85 entirely covers the lower surface of the second intermetallic compound layer 77. For example, the roughened-surface copper metal film 85 entirely covers the first opposing surface 31.

The bonding member 65 does not project outward from, for example, the side surface of the first connection terminal 30. In other words, the solder layer 90 (refer to FIG. 9) and the like of the bonding member 65 do not project outward from the side surface of the first connection terminal 30 in the planar direction (left-right direction in FIG. 10). The bonding member 65 does not project outward from, for example, the side surface of the second connection terminal 50. The bonding member 65 allows the first connection terminal 30 to be bonded perpendicular to the second connection terminal 50. Thus, the bonding member 65 electrically connects the first connection terminal 30 to the second connection terminal 50. The semiconductor element 40 is mounted on the wiring substrate 20 through the steps described above.

In the present embodiment, a connection structural body includes the first connection terminal 30, the bonding member 65, and the second connection terminal 50.

The present embodiment has the following advantages in addition to advantages (1-1) to (1-3) of the first embodiment.

(2-1) The first intermetallic compound layer 76 entirely overlaps the second intermetallic compound layer 77 in plan view. With this structure, the first intermetallic compound layer 76 and the second intermetallic compound layer 77 are formed in a layer-like manner over the entire intermetallic compound layer 75 in the planar direction. When the first intermetallic compound layer 76 and the second intermetallic compound layer 77 are layered, Cu easily diffuses into the first intermetallic compound layer 76 of $Cu_6Sn_5$ as the bonding member 65 is formed, and thus part of the first intermetallic compound layer 76 readily changes into the intermetallic compound of $Cu_3Sn$. This increases the region of the second intermetallic compound layer 77 formed by $Cu_3Sn$. Since $Cu_3Sn_5$ is superior to $Cu_6Sn$ in physical properties such as resistance, melting temperature, Young's modulus, tensile strength, and thermal conductivity, the physical properties of the bonding member 65 are improved.

Third Embodiment

A third embodiment will now be described with reference to FIGS. 11 to 13. The semiconductor device of this embodiment differs from those of the first and second embodiments in the structure of the connection structural body. Hereafter, the difference from the first embodiment will be mainly described. The same reference numerals are given to those components that are the same as the corresponding components illustrated in FIGS. 1 to 10. Such elements will not be described in detail.

Figure 11:
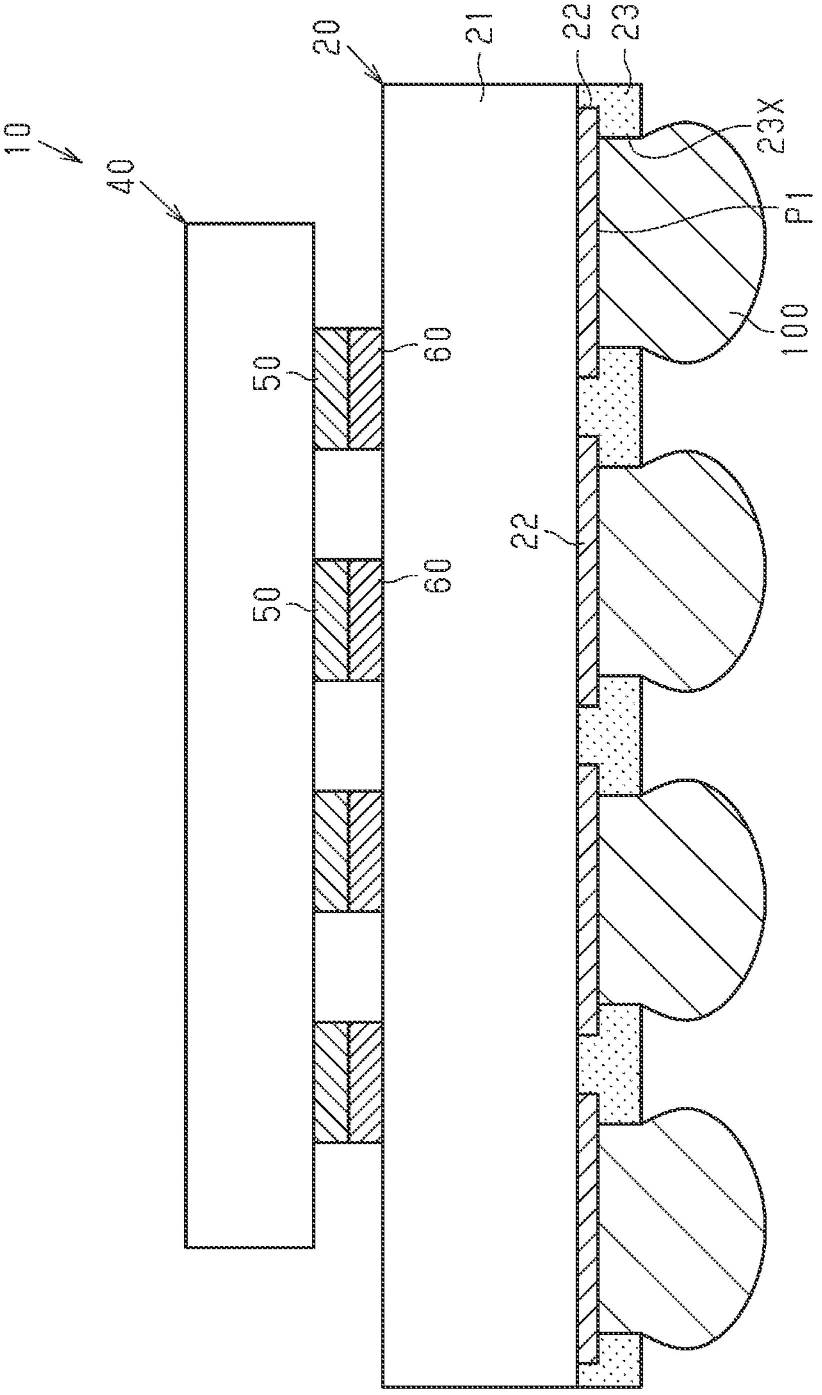
FIG. 11 is a schematic cross-sectional view of a semiconductor device in accordance with a third embodiment.

As illustrated in FIG. 11, the wiring substrate 20 of the present embodiment includes bonding members 60 formed on the substrate body 21. The semiconductor element 40 of the present embodiment includes the second connection terminals 50 formed on the circuit formation surface (here, lower surface) of the semiconductor element 40. The second connection terminals 50 are bonded to the bonding members 60. In the semiconductor device 10 of the present embodiment, the semiconductor element 40 is mounted on the wiring substrate 20 when the second connection terminals 50 are bonded to the bonding members 60. In other words, the bonding members 60 act as first connection terminals connected to the semiconductor element 40 in the semiconductor device 10 of the present embodiment. In the semiconductor device 10 of the present embodiment, the first connection terminals are entirely formed by the bonding members 60.

Bonding Member 60

The bonding members 60 are formed on the upper surface of the substrate body 21. In the wiring substrate 20 of the present embodiment, a plurality of bonding members 60 is formed on the upper surface of the substrate body 21. Each bonding member 60 is arranged on part of the upper surface of the substrate body 21. The bonding member 60 is electrically connected to the wiring layer 22 via, for example, wiring layers and through-electrodes (not illustrated) in the substrate body 21. For example, the bonding member 60 may have a thickness (film thickness) in a range between 1 μm and 20 μm, inclusive.

Figure 12:
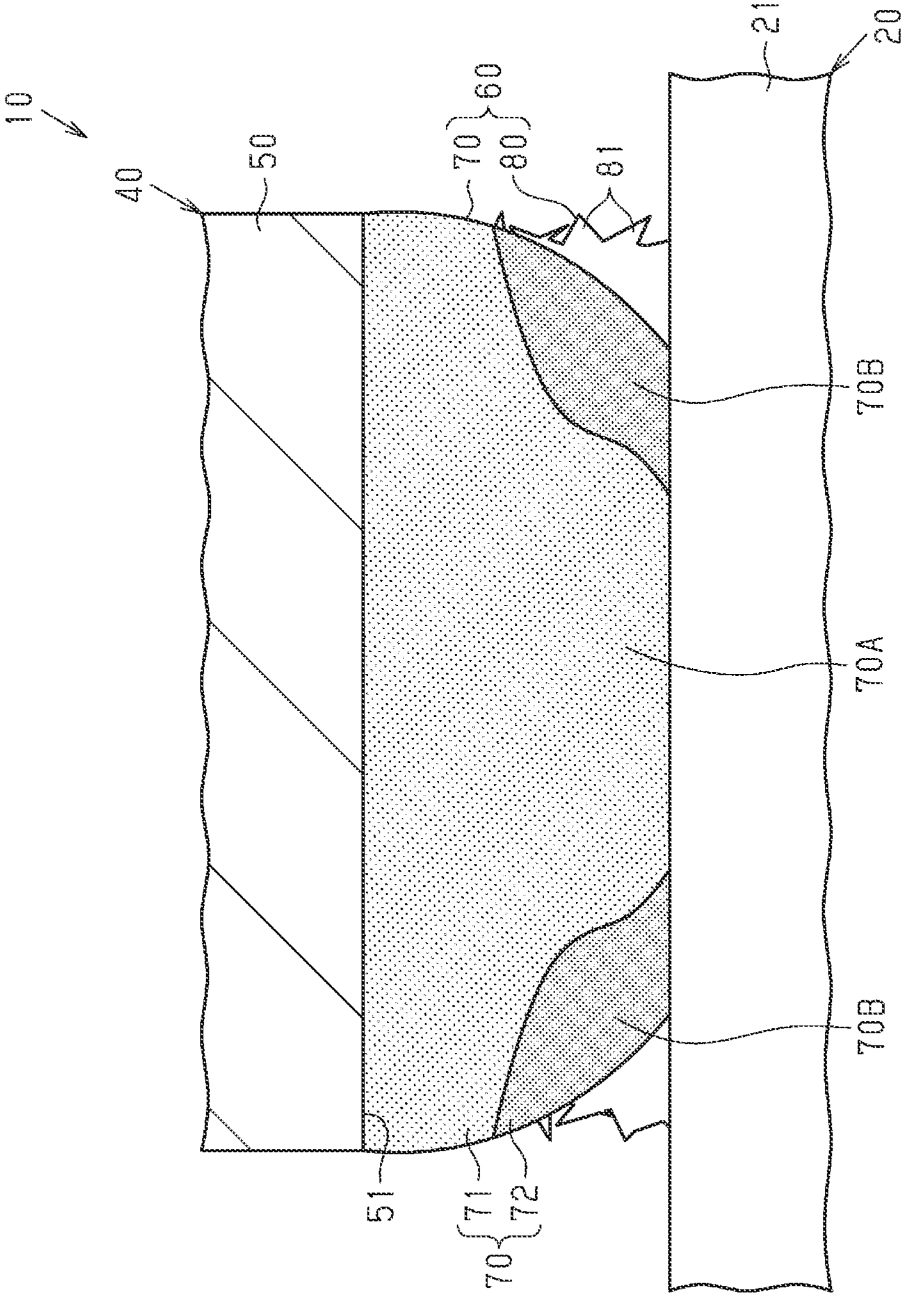
FIG. 12 is a schematic cross-sectional view illustrating part of the semiconductor device in FIG. 11.

As illustrated in FIG. 12, the bonding member 60 includes the intermetallic compound layer 70. For example, most of the bonding member 60 is formed by the intermetallic compound layer 70. In an example, the bonding member 60 is formed by the intermetallic compound layer 70 except for the outer edge portion located toward the upper surface side of the substrate body 21. The intermetallic compound layer 70 includes, for example, a portion extending over the entire length of the bonding member 60 in the thickness-wise direction. In other words, a portion of the intermetallic compound layer 70 extends from the second opposing surface 51 to the upper surface of the substrate body 21 in the thickness-wise direction of the bonding member 60. In the example illustrated in FIG. 12, the intermetallic compound layer 70 extends over the entire length of the bonding member 60 in the thickness-wise direction at a central portion of the bonding member 60 in plan view.

The intermetallic compound layer 70 is structured by, for example, the first intermetallic compound layer 71 and the second intermetallic compound layer 72 that differs from the first intermetallic compound layer 71 and is formed on the first intermetallic compound layer 71 in the thickness-wise direction of the bonding member 60. The first intermetallic compound layer 71 is formed from, for example, the intermetallic compound of $Cu_6Sn_5$. The second intermetallic compound layer 72 is formed from, for example, the intermetallic compound of $Cu_3Sn$. The first and second intermetallic compound layers 71 and 72 have the same structure as that illustrated in FIG. 2.

Figure 13:
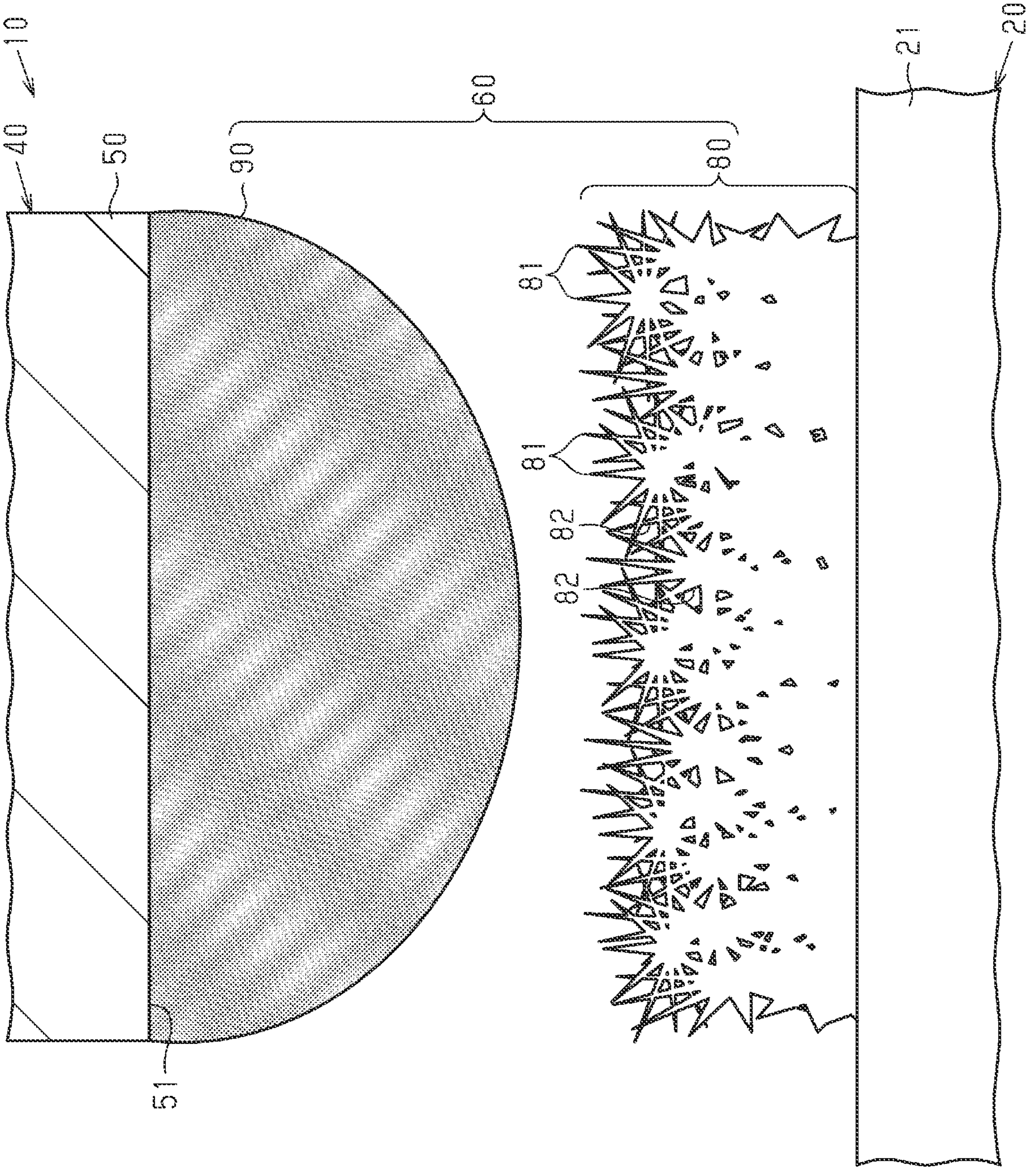
FIG. 13 is a schematic exploded cross-sectional view illustrating the part of the semiconductor device in FIG. 11.

As illustrated in FIG. 13, the bonding member 60 includes the roughened-surface copper metal film 80 formed on the upper surface of the substrate body 21, and the solder layer 90 formed on the second opposing surface 51 of the second connection terminal 50. FIG. 13 illustrates a cross-sectional structure of part of the semiconductor device 10 before the semiconductor element 40 is bonded to the wiring substrate 20. The structures of the roughened-surface copper metal film 80 and the solder layer 90 will be described below.

Roughened-Surface Copper Metal Film 80

The roughened-surface copper metal film 80 is formed on the upper surface of the substrate body 21. In the wiring substrate 20 of the present embodiment, a plurality of roughened-surface copper metal films 80 is formed on the upper surface of the substrate body 21. Each roughened-surface copper metal film 80 is arranged on part of the upper surface of the substrate body 21. The roughened-surface copper metal film 80 is electrically connected to the wiring layer 22 illustrated in FIG. 11 via, for example, wiring layers and through-electrodes (not illustrated) in the substrate body 21. For example, the roughened-surface copper metal film 80 may have a thickness (film thickness) in a range between 1 μm and 20 μm, inclusive.

The roughened-surface copper metal film 80 is a plating film having a roughened surface (both upper and side surfaces or only upper surface). The surface of the roughened-surface copper metal film 80 includes microscopic irregularities. The roughened-surface copper metal film 80 is structured by the sheeted deposits 81, which are formed from a plating metal of copper, piled over one another on the upper surface of the substrate body 21. The roughened-surface copper metal film 80 includes the pores 82 that are formed between the sheeted deposits 81. The roughened-surface copper metal film 80 is a plating film formed by an electrolytic copper plating process. The roughened-surface copper metal film 80 is, for example, a metal film formed by a plating film including only copper.

The roughened-surface copper metal film 80 is formed on, for example, a seed layer (not illustrated) formed on the upper surface of the substrate body 21. The roughened-surface copper metal film 80 is integrated with, for example, the seed layer. The material of the seed layer may be, for example, copper or a copper alloy.

Solder Layer 90

The solder layer 90, for example, entirely covers the second opposing surface 51 of the second connection terminal 50. For example, the solder layer 90 is arranged facing the roughened-surface copper metal film 80. For example, the solder layer 90 projects from the second opposing surface 51 toward the roughened-surface copper metal film 80.

The bonding member 60 includes, for example, the roughened-surface copper metal film 80 and the solder layer 90 that are integrated with each other in a reflow soldering process. The intermetallic compound layer 70 illustrated in FIG. 12 is formed by the reaction between the metal (e.g., Cu) of the roughened-surface copper metal film 80 and the metal (e.g., Sn) of the solder layer 90 disposed in a large number of pores 82 of the roughened-surface copper metal film 80. As illustrated in FIG. 12, the bonding member 60 includes, for example, the roughened-surface copper metal film 80. The residue of part of the roughened-surface copper metal film 80 that does not form the intermetallic compound layer 70 includes the sheeted deposits 81 of copper in the bonding member 60. For example, the roughened-surface copper metal film 80 forms part of the side surface of the bonding member 60 close to the substrate body 21. The roughened-surface copper metal film 80 is composed of, for example, Cu.

The bonding member 60 does not project outward from, for example, the side surface of the second connection terminal 50. In other words, the solder layer 90 (refer to FIG. 13) and the like of the bonding member 60 do not project outward from the side surface of the second connection terminal 50 in the planar direction (left-right direction in FIG. 12).

A connection structural body includes the second connection terminal 50 and the bonding member 60 described above.

Method for Manufacturing Semiconductor Device 10

A method for manufacturing the semiconductor device 10 will now be described. Steps of forming the roughened-surface copper metal film 80 and the bonding member 60 will be described in detail.

As illustrated in FIG. 13, the roughened-surface copper metal film 80 is formed on the upper surface of the substrate body 21. Specifically, first, a seed layer (not illustrated) is formed to cover the upper surface of the substrate body 21. The seed layer may be formed in, for example, an electroless copper plating process or a sputtering process. Then, a resist pattern (not illustrated) including open portions corresponding to the roughened-surface copper metal films 80 is formed on the seed layer. Subsequently, an electrolytic copper plating process is performed to form the roughened-surface copper metal films 80 in the open portions of the resist pattern. In the electrolytic copper plating process, the resist pattern is used as a plating mask, and the seed layer is used as a plating power feeding layer.

As illustrated in FIG. 13, the semiconductor element is prepared with the solder layer 90 formed on the lower surface of the second connection terminal 50.

Then, the roughened-surface copper metal film 80 is bonded to the solder layer 90 in a reflow soldering process. In an example, after the solder layer 90 is placed on the roughened-surface copper metal film 80, a reflow soldering process is performed to melt the solder layer 90 and bond the solder layer 90 with the roughened-surface copper metal film 80. In this manner, the bonding member 60 illustrated in FIG. 12 includes the intermetallic compound layer 70 and the roughened-surface copper metal film 80.

The present embodiment has the same advantages as the first embodiment.

OTHER EMBODIMENTS

The above-described embodiments may be modified as follows. The above embodiments and the following modifications may be combined as long as the combined modifications remain technically consistent with each other.

In the first and second embodiments, the roughened-surface copper metal film 80, 85 covers only the first opposing surface 31 among the surfaces of the first connection terminal 30. However, there is no limitation to such a structure.

Figure 14:
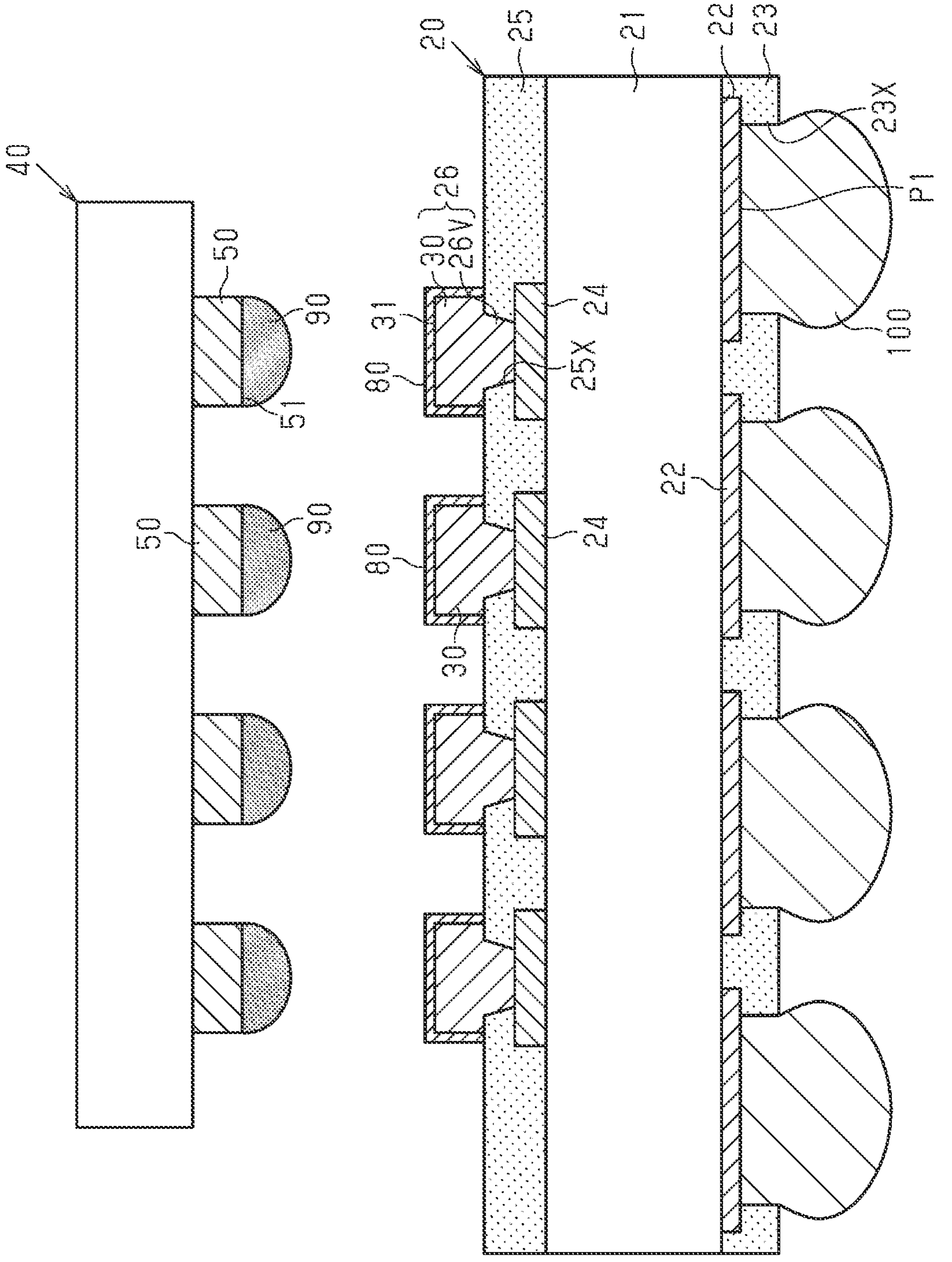
FIG. 14 is a schematic exploded cross-sectional view illustrating a semiconductor device of a modified example.

For example, as illustrated in FIG. 14, the roughened-surface copper metal film 80 may cover the side surface and the first opposing surface 31 of the first connection terminal 30. In the same manner, the roughened-surface copper metal film 85 (refer to FIG. 8) may cover the side surface and the first opposing surface 31 of the first connection terminal 30.

The structure of the bonding member 60 in the first and third embodiments may be changed.

For example, the bonding member 60 may include only the intermetallic compound layer 70. In this case, the roughened-surface copper metal film 80 entirely forms the intermetallic compound layer 70, for example, in a reflow soldering process.

The intermetallic compound layer 70, for example, does not have to include the portion 70A extending over the entire length of the bonding member 60 in the thickness-wise direction. In this case, the intermetallic compound layer 70 extends from the second opposing surface 51 to an intermediate part of the bonding member 60 in the thickness-wise direction. Further, the roughened-surface copper metal film 80 is formed between the intermetallic compound layer 70 and the second opposing surface 51 or the upper surface of the substrate body 21.

The volume of the first intermetallic compound layer 71 may be, for example, less than or equal to the volume of the second intermetallic compound layer 72.

The structure of the bonding member 65 in the second embodiment may be changed.

The intermetallic compound layer 75 may include, for example, a portion extending over the entire length of the bonding member 65 in the thickness-wise direction. In this case, for example, the second intermetallic compound layer 77 at least partially covers the first opposing surface 31.

The bonding member 65 may include, for example, only the intermetallic compound layer 75. In this case, the roughened-surface copper metal film 85 entirely forms the intermetallic compound layer 75, for example, in a reflow soldering process.

The volume of the first intermetallic compound layer 76 may be, for example, less than or equal to the volume of the second intermetallic compound layer 77.

In the first and second embodiments, the roughened-surface copper metal film 80, 85 is directly bonded to the first opposing surface 31 of the first connection terminal 30. However, there is no limitation to such a structure. For example, a surface-processed layer may be formed to cover the first opposing surface 31 of the first connection terminal 30, and then the roughened-surface copper metal film 80, 85 may be formed on the surface-processed layer. The surface-processed layer may be, for example, a metal layer such as a Au layer, a Ni layer/Au layer, or a Ni layer/Pd layer/Au layer.

In the first and second embodiments, the roughened-surface copper metal film 80, 85 is formed on the first connection terminal 30 of the wiring layer 26. However, there is no limitation to such a structure. For example, the wiring layer 26 may be entirely formed by the roughened-surface copper metal film 80, 85. In other words, the roughened-surface copper metal film 80, 85 may form the via wiring 26V and the first connection terminal 30. In this case, the roughened-surface copper metal film 80, 85 is formed on the upper surface of the wiring layer 24 exposed from the open portion 25X. That is, the roughened-surface copper metal film 80, 85 is structured by the deposits 81, 86, which are formed from a plating metal of copper, piled over one another on the upper surface of the wiring layer 24 exposed from the open portion 25X.

In the first and second embodiments, the roughened-surface copper metal film 80, 85 is formed on the first connection terminal 30 of the wiring substrate 20, and the solder layer 90 is formed on the second connection terminal 50 of the semiconductor element 40. However, there is no limitation to such a structure. For example, the solder layer 90 may be formed on the first connection terminal 30 of the wiring substrate 20, and the roughened-surface copper metal film 80, 85 may be formed on the second connection terminal 50 of the semiconductor element 40.

In the third embodiment, the roughened-surface copper metal film 80 is formed on the upper surface of the substrate body 21, and the solder layer 90 is formed on the second connection terminal 50 of the semiconductor element 40. However, there is no limitation to such a structure. For example, the solder layer 90 may be formed on the upper surface of the substrate body 21, and the roughened-surface copper metal film 80 may be formed on the second connection terminal 50 of the semiconductor element 40.

In the third embodiment, the bonding member 60 may be changed to the bonding member 65.

In the third embodiment, the roughened-surface copper metal film 80 may be changed to the roughened-surface copper metal film 85.

In each embodiment, the roughened-surface copper metal film 80, 85 may be changed to a roughened-surface metal film formed from a metal material other than copper.

In each embodiment, the structure of the wiring substrate 20 may be changed.

In each embodiment, the structure of the semiconductor element 40 may be changed.

In the first and second embodiments, the first connection terminal 30 is not limited to a metal post.

In each embodiment, the second connection terminal 50 is not limited to a metal post.

In the first and second embodiments, the first connection terminal 30 may be formed from a metal material other than copper.

In each embodiment, the second connection terminal 50 may be formed from a metal material other than copper.

In each embodiment, the external connection terminals 100 may be omitted from the semiconductor device 10.

Clause

This disclosure further encompasses the following embodiments.

1. A method for manufacturing a connection structural body, the method including:
   - forming a first connection terminal including a first opposing surface;
   - forming a roughened-surface copper metal film, structured by deposits of copper piled over one another on the first opposing surface such that pores are formed, through an electrolytic copper plating process;
   - forming a second connection terminal including a second opposing surface, facing the first opposing surface, on which a solder layer is formed; and
   - bonding the roughened-surface copper metal film to the solder layer through a reflow soldering process, in which
   - the roughened-surface copper metal film is formed by an electrolytic copper plating process that uses an electrolytic copper plating bath to which a polymer is added, and
   - the solder layer melted by the reflow soldering process enters the pores of the roughened-surface copper metal film so that the intermetallic compound layer is formed by a reaction between a metal of the solder layer and a metal of the roughened-surface copper metal film.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A connection structural body, comprising:
   - a first connection terminal;
   - a second connection terminal facing the first connection terminal; and
   - a bonding member bonding the first connection terminal and the second connection terminal,
   - wherein the bonding member includes an intermetallic compound layer that is formed by a roughened-surface metal film, structured by deposits of metal piled over one another such that pores are formed, and a solder layer that is disposed in the pores,
   - wherein the intermetallic compound layer is structured by a stack of a first intermetallic compound layer and a second intermetallic compound layer that differs from the first intermetallic compound layer, wherein the second intermetallic compound layer is stacked on the first intermetallic compound layer in a thickness-wise direction of the bonding member,
   - wherein the first intermetallic compound layer extends over an entire length of the bonding member in the thickness-wise direction at a central portion of the intermetallic compound layer in plan view, and
   - wherein the second intermetallic compound layer is stacked on the first intermetallic compound layer at an outer edge portion of the intermetallic compound layer in plan view.

2. The connection structural body according to claim 1, wherein the roughened-surface metal film is formed from a metal material including copper, the solder layer is formed from a metal material including tin, the first intermetallic compound layer is formed by an intermetallic compound of $Cu_6Sn_5$, and the second intermetallic compound layer is formed by an intermetallic compound of $Cu_3Sn$.

3. The connection structural body according to claim 1, wherein the first intermetallic compound layer entirely overlaps the second intermetallic compound layer in plan view.

4. The connection structural body according to claim 1, wherein the deposits are sheeted deposits, and a side surface of the bonding member is structured by the sheeted deposits that are piled over one another.

5. A semiconductor device, comprising:
   - a wiring substrate including a first connection terminal;
   - a semiconductor element mounted on the wiring substrate and including a second connection terminal that faces the first connection terminal; and
   - a bonding member bonding the first connection terminal and the second connection terminal,
   - wherein the bonding member includes an intermetallic compound layer that is formed by a roughened-surface metal film, structured by deposits of metal piled over one another such that pores are formed, and a solder layer that is disposed in the pores,
   - wherein the intermetallic compound layer is structured by a stack of a first intermetallic compound layer and a second intermetallic compound layer that differs from the first intermetallic compound layer, wherein the second intermetallic compound layer is stacked on the first intermetallic compound layer in a thickness-wise direction of the bonding member, wherein the first intermetallic compound layer extends over an entire length of the bonding member in the thickness-wise direction at a central portion of the intermetallic compound layer in plan view, and wherein the second intermetallic compound layer is stacked on the first intermetallic compound layer at an outer edge portion of the intermetallic compound layer in plan view.

6. A connection structural body, comprising:

a first connection terminal;

a second connection terminal facing the first connection terminal; and a bonding member bonding the first connection terminal and the second connection terminal, wherein the bonding member includes an intermetallic compound layer that is formed by a roughened-surface metal film, structured by deposits of metal piled over one another such that pores are formed, and a solder layer that is disposed in the pores, and wherein the intermetallic compound layer includes:

a first intermetallic compound layer extending over an entire length of the bonding member in a thickness-wise direction from the first connection terminal to the second connection terminal, and a second intermetallic compound layer that differs from the first intermetallic compound layer, wherein the second intermetallic compound layer is stacked on the first intermetallic compound layer in the thickness-wise direction of the bonding member and surrounds a portion of the first intermetallic compound layer.

* * * * *